United States Patent
Ikehashi

(10) Patent No.: US 7,485,958 B2
(45) Date of Patent: Feb. 3, 2009

(54) DEVICE WITH BEAM STRUCTURE, AND SEMICONDUCTOR DEVICE

(75) Inventor: Tamio Ikehashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 259 days.

(21) Appl. No.: 11/438,690

(22) Filed: May 23, 2006

(65) Prior Publication Data

US 2007/0138608 A1 Jun. 21, 2007

(30) Foreign Application Priority Data

Dec. 20, 2005 (JP) ............................. 2005-366648

(51) Int. Cl.
*H01L 23/48* (2006.01)
*H01L 23/52* (2006.01)
*H01L 29/40* (2006.01)

(52) U.S. Cl. ...................................... 257/735; 257/736
(58) Field of Classification Search ................. 257/735, 257/433, 466, 465, E23.014, 736, 773, 775, 257/798

See application file for complete search history.

(56) References Cited

U.S. PATENT DOCUMENTS

| | | | | |
|---|---|---|---|---|
| 5,587,343 A | * | 12/1996 | Kano et al. | ..................... 438/52 |
| 5,936,159 A | * | 8/1999 | Kano et al. | ............... 73/514.36 |
| 6,567,715 B1 | * | 5/2003 | Sinclair et al. | .............. 700/110 |
| 6,822,304 B1 | * | 11/2004 | Honer | .......................... 257/418 |
| 2001/0045228 A1 | * | 11/2001 | Takada et al. | ................ 136/244 |
| 2004/0050674 A1 | | 3/2004 | Rubel | |
| 2005/0102833 A1 | * | 5/2005 | Hantschel et al. | ............. 29/874 |
| 2005/0270128 A1 | * | 12/2005 | Nakanishi et al. | ............. 335/78 |
| 2005/0286110 A1 | * | 12/2005 | Wen et al. | ..................... 359/290 |
| 2006/0038301 A1 | * | 2/2006 | Suzuki | ......................... 257/775 |
| 2006/0056132 A1 | * | 3/2006 | Yoshida et al. | .............. 361/294 |
| 2007/0268095 A1 | * | 11/2007 | Chou | ........................... 333/262 |

FOREIGN PATENT DOCUMENTS

JP 2004-170508 A 6/2004

OTHER PUBLICATIONS

H.C. Lee et al., "Silicon Bulk Micromachined RF MEMS Switches with 3.5 Volts Operation by using Piezoelectric Actuator," 2004 IEEE MTT-S Digest, pp. 585-588.

M.J. Kim et al., "Design, Fabrication and Characterization of Piezo-electric Multi-Layer Cantilever Microactuators for the Minimum Initial Deflection," Transducers '99, Jun. 7-10, 1999, pp. 1758-1761.

* cited by examiner

*Primary Examiner*—S. V Clark
(74) *Attorney, Agent, or Firm*—Foley & Lardner LLP

(57) ABSTRACT

A device with a beam structure includes a substrate, an anchor and a cavity which are provided on and over the substrate, respectively, and a beam structure which is provided on the anchor and over the cavity, extends in a first direction and includes a plurality of convex portions and a plurality of concave portions, each of the convex portions having such a stress gradient as to provide a convex warp, and each of the concave portions having such a stress gradient as to provide a concave warp. The convex portions and the concave portions are alternately repeatedly arranged.

20 Claims, 15 Drawing Sheets

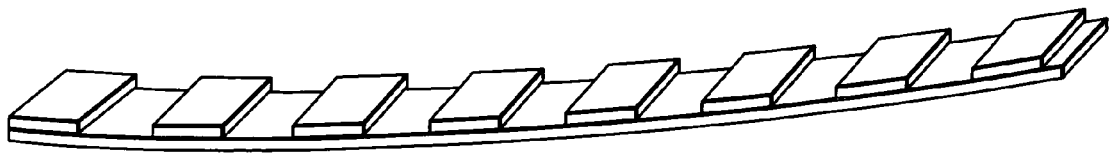
FIG. 8
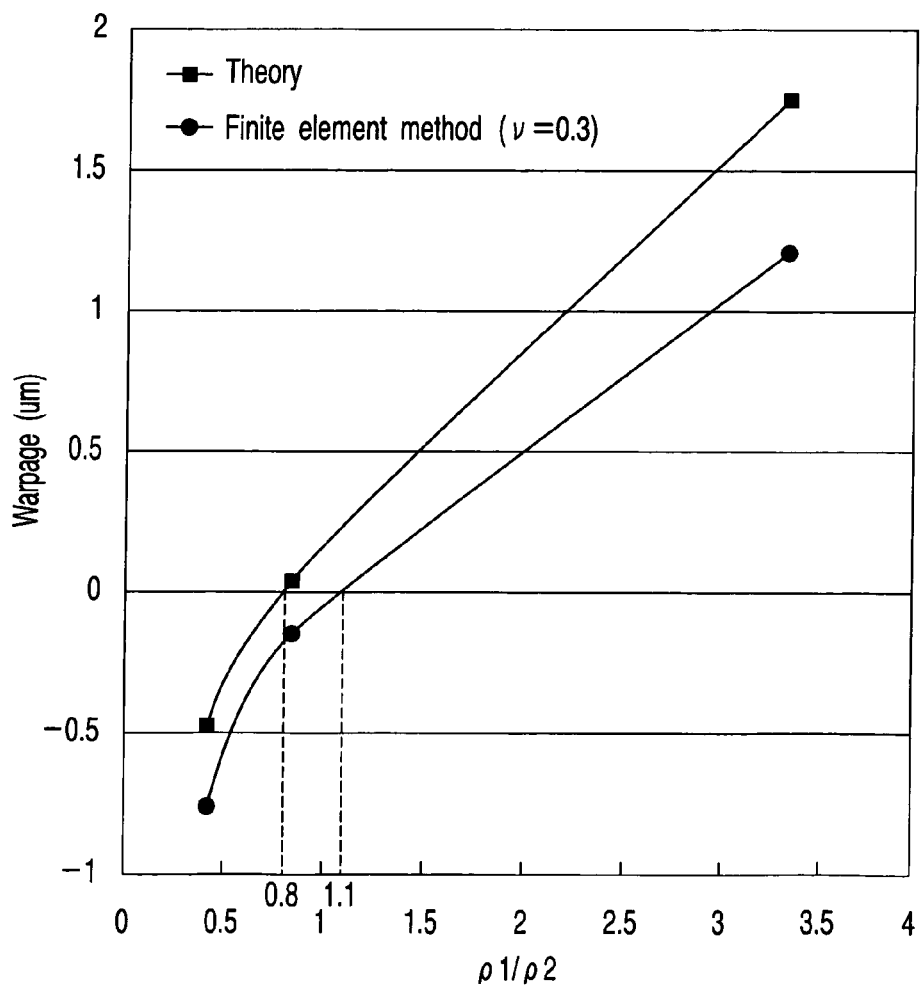
FIG. 9
FIG. 10

DEVICE WITH BEAM STRUCTURE, AND SEMICONDUCTOR DEVICE

CROSS-REFERENCE TO RELATED APPLICATIONS

This application is based upon and claims the benefit of priority from prior Japanese Patent Application No. 2005-366648, filed Dec. 20, 2005, the entire contents of which are incorporated herein by reference.

BACKGROUND OF THE INVENTION

1. Field of the Invention

The present invention relates generally to a device with a beam structure, and a semiconductor device, and more particularly to the device and semiconductor device including a MEMS (Micro-Electro-Mechanical System) device.

2. Description of the Related Art

In recent years, the reduction in scaling of micromachine technology has constantly been progressing. The micromachine technology includes MEMS technology. The MEMS technology is a technology in which movable three-dimensional devices are finely fabricated using semiconductor process technologies.

As devices that are fabricated using MEMS technology, a variable capacitor, a switch, an acceleration sensor, a pressure sensor, an RF (radio frequency) filter, a gyroscope and a mirror device, for instance, have been principally researched and developed.

In a case where a beam is fabricated over a cavity using MEMS technology, it is a very important point how to suppress a warp occurring due to residual stress in a layer that constitutes the beam. For example, in the case of a MEMS variable capacitor, if a warp occurs in an electrode layer that constitutes the variable capacitor, a desired capacitance value could not be obtained. In addition, if a warp occurs in an actuator that moves the electrode layer, the capacitance value of the variable capacitor could not be varied at a desired voltage value.

Such the warp due to residual stress tends to occur in the case where the beam is formed of two or more layers. The reason is that it is difficult to equalize the values of residual stresses in the respective layers. For example, in the case of a piezoelectric type variable capacitor or switch, at least three layers need to be used in a piezoelectric actuator, and thus the warp tends to occur in particular. As a related technique, a technique relating to a warp of a piezoelectric actuator is disclosed (see Myeong-Jin Kim and Young-Ho Cho, "DESIGN, FABRICATION AND CHARACTERIZATION OF PIEZOELECTRIC MULTI-LAYER CANTILEVER MICROACTUATORS FOR THE MINIMUM INITIAL DEFLECTION", Transducer '99, Jun. 7-10, 1999, pp. 1758-1761).

BRIEF SUMMARY OF THE INVENTION

According to a first aspect of the present invention, there is provided a device with a beam structure, comprising:
a substrate;
an anchor and a cavity which are provided on and over the substrate, respectively; and
a beam structure which is provided on the anchor and over the cavity, extends in a first direction and includes a plurality of convex portions and a plurality of concave portions, each of the convex portions having such a stress gradient as to provide a convex warp, and each of the concave portions having such a stress gradient as to provide a concave warp,
wherein the convex portions and the concave portions are alternately repeatedly arranged.

According to a second aspect of the present invention, there is provided a device with a beam structure, comprising:
a substrate;
an anchor and a cavity which are provided on and over the substrate, respectively; and
a beam structure which is provided on the anchor and over the cavity, extends in a first direction and includes a base portion and a support portion,
wherein the support portion includes a first convex portion having such a stress gradient as to provide a convex warp, and a first concave portion having such a stress gradient as to provide a concave warp, the support portion adjusting a height of the base portion, which is different from a height of the anchor.

According to a third aspect of the present invention, there is provided a semiconductor device comprising:
a substrate;
an anchor and a cavity which are provided on and over the substrate, respectively;
an actuator which is provided on the anchor and over the cavity and extends in a first direction; and
a plurality of first adjustment layers which are added partly to the actuator and adjust a warp of the actuator.

BRIEF DESCRIPTION OF THE SEVERAL VIEWS OF THE DRAWING

FIG. 8 is a table showing conditions of three cases (case 1 to case 3) of cantilevers shown in FIG. 7;

FIG. 9 is a perspective view illustrating a warp of the cantilever by the finite element method;

FIG. 10 is a graph showing warpage according to a finite element method (Poisson ratio ν=0.3) and theoretical values when ρ1/ρ2 is varied;

DETAILED DESCRIPTION OF THE INVENTION

Figure 1:
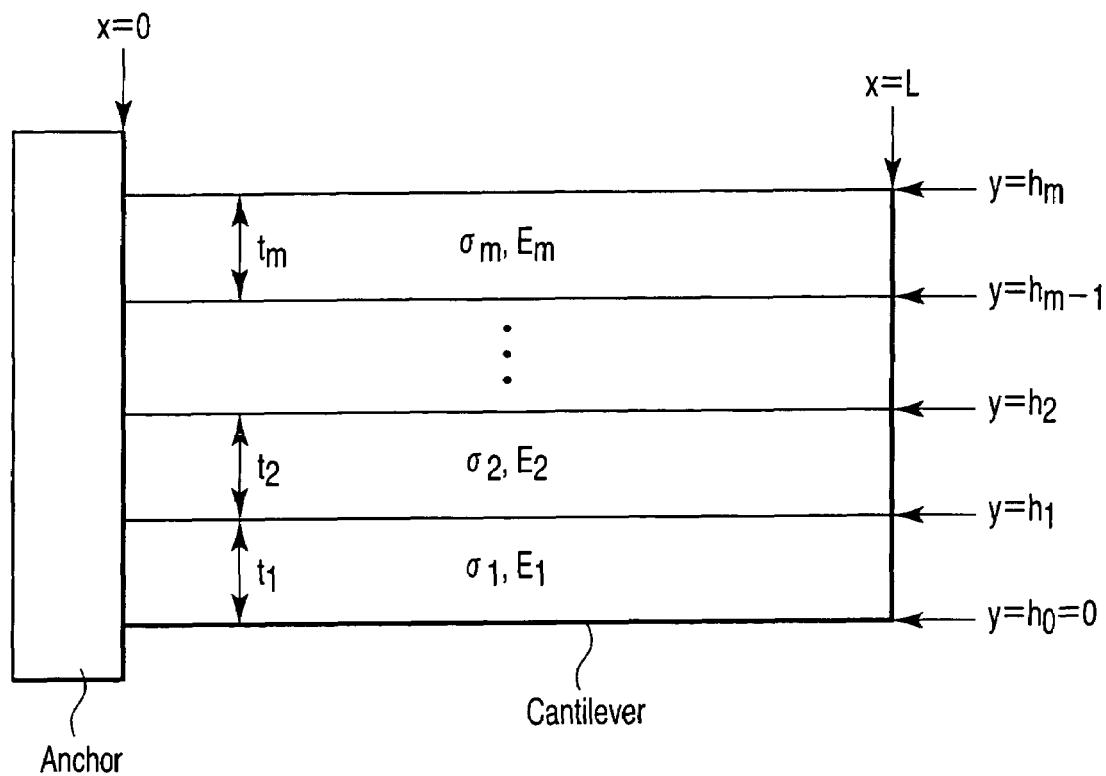
FIG. 1 is a cross-sectional view for explaining a warp of a cantilever that is composed of a plurality of layers.

Embodiments of the present invention will now be described with reference to the accompanying drawings. In the description below, elements having the same function and structure are denoted by like reference numerals, and an overlapping description is given only where necessary.

To begin with, the principle of a device according to an embodiment of the invention (to be described in connection with first and second embodiments) is explained, following which the structure of a specific semiconductor device will be described.

FIRST EMBODIMENT

The warpage (i.e. amount of a warp) of a beam is first explained. FIG. 1 is a cross-sectional view for explaining a warp of a cantilever that is composed of a plurality of layers.

A cantilever (or a beam), which is composed of an m-number of layers, is provided on a side surface of an anchor. Specifically, the cantilever is provided over a cavity. The plural layers of the cantilever have residual stress (also referred to as "internal stress"). If two layers having different residual stresses are stacked, a stress gradient occurs in the thickness direction of the layers. Similarly, a warp occurs due to the stress gradient in the cantilever that comprises the plural layers. In the description below, the stress gradient refers to a stress gradient in the film thickness direction.

As is shown in FIG. 1, in the case where the film thickness, residual stress and Young's modulus of an i-th (i=1, 2, ..., m) layer are $t_i$, $\sigma_i$ and $E_i$, respectively, a warp with a radius $\rho$ of curvature, which is expressed by formula (1), occurs. In formula (1), $h_i$ is defined by formula (2).

$$\frac{1}{\rho} = \frac{6\left(\sum_{i=1}^{m} E_i(h_i - h_{i-1})\right)\left(\sum_{i=1}^{m} \sigma_i(h_i^2 - h_{i-1}^2)\right) - 6\left(\sum_{i=1}^{m} E_i(h_i^2 - h_{i-1}^2)\right)\left(\sum_{i=1}^{m} \sigma_i(h_i - h_{i-1})\right)}{3\left(\sum_{i=1}^{m} E_i(h_i^2 - h_{i-1}^2)\right)^2 - 4\left(\sum_{i=1}^{m} E_i(h_i - h_{i-1})\right)\left(\sum_{i=1}^{m} E_i(h_i^3 - h_{i-1}^3)\right)} \quad (1)$$

$$h_i = \sum_{j=1}^{i} t_j \quad (2)$$

In formula (1), if the radius $\rho$ of curvature is a positive value, a concave warp occurs. If the radius $\rho$ of curvature is a negative value, a convex warp occurs. If the length of the cantilever in the x-direction is L, the warpage z is given by formula (3).

$$z = \frac{L^2}{2\rho} \quad (3)$$

Even in the case of a single-layer cantilever having a stress gradient, warpage can be expressed by formula (2) by decreasing the film thickness $t_i$ and sufficiently increasing m.

In the case where the cantilever is composed of two layers, the direction of a warp is determined only by relative magnitudes of residual stresses of the upper and lower layers. However, in the case where the cantilever is composed of three or more layers, as suggested by formula (2), the direction of a warp is determined by the film thickness and Young's modulus of each layer, as well as the residual stress of each layer.

Figure 2:
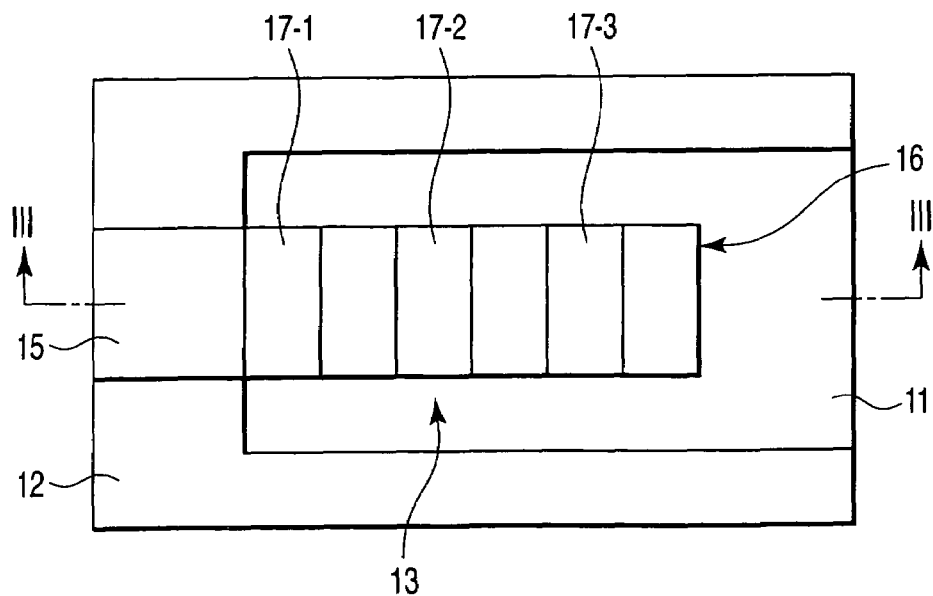
FIG. 2 is a plan view of a device comprising a cantilever according to a first embodiment of the present invention.
Figure 3:
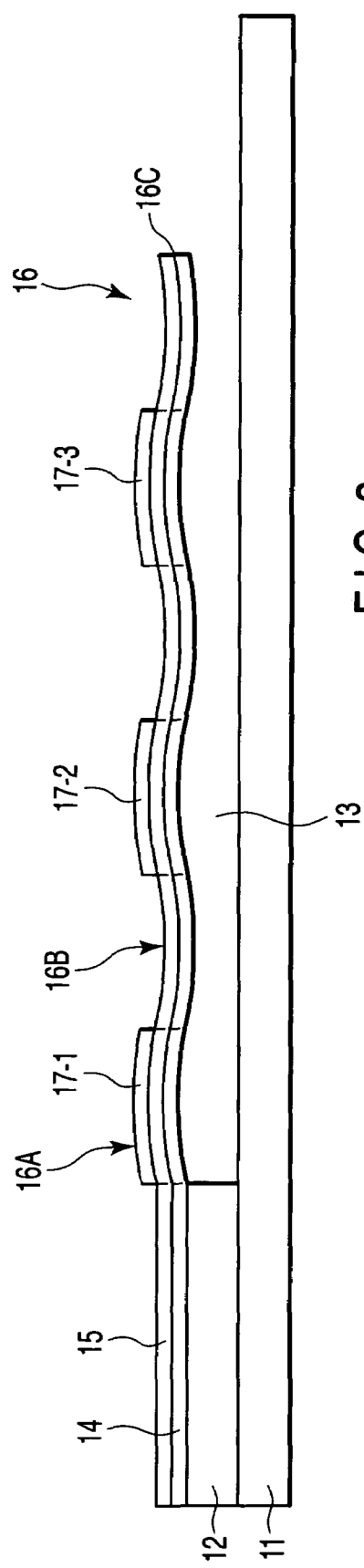
FIG. 3 is a cross-sectional view taken along line III-III in FIG. 2.

FIG. 2 is a plan view of a device comprising a cantilever according to a first embodiment of the present invention. FIG. 3 is a cross-sectional view taken along line III-III in FIG. 2. Each of the layers that constitute the cantilever may be an insulating layer or a metal layer, if it has a stress that meets a predetermined condition. Thus, in the cross section of FIG. 3, hatching of each layer is omitted. The same applies to FIG. 4 to FIG. 6 which are to be described later.

An anchor 12 is provided on a substrate 11. The anchor 12 is provided partly on the substrate 11. The region where the anchor 12 is absent is a cavity 13.

A cantilever 16 is provided over the anchor 12 and cavity 13. Specifically, one end portion (proximal end portion) of the cantilever 16 is provided on the anchor 12 such that the cantilever 16 projects from over the anchor 12 to over the cavity 13. The other end portion (distal end portion) of the cantilever 16 is provided over the cavity and is not fixed.

The cantilever 16 comprises a first layer 14, a second layer 15 provided on the first layer 14, and a plurality of adjustment layers (e.g. three adjustment layers 17-1, 17-2 and 17-3 in this embodiment) that are provided partly on the second layer 15. The first layer 14 and second layer 15 have residual stress. The residual stress is a stress that is possessed by the layer itself and does not depend on external force.

The second layer 15 has a greater tensile property than the first layer 14. For example, the second layer 15 has a tensile stress, and the first layer 14 has a compressive stress. The tensile stress is defined by a positive sign. The compressive stress is defined by a negative sign.

It should suffice if the residual stresses of the first layer 14 and second layer 15 are relatively different. It may thus be possible that both the first layer 14 and second layer 15 have tensile stresses, and that the tensile stress of the second layer 15 is relatively greater than that of the first layer 14. Alternatively, it may be possible that both the first layer 14 and second layer 15 have compressive stresses, and that the compressive stress of the first layer 14 is relatively greater than that of the second layer 15.

Thereby, a beam portion 16C formed of the first layer 14 and second layer 15 (i.e. a portion of the cantilever 16, which excludes adjustment layers 17) has such a stress gradient as to provide a concave warp. Accordingly, the beam portion 16C warps upward. The wording "warping upward" refers to a state in which both end portions of the beam are positioned upward of a tangent line of a central portion of the beam.

The cantilever 16 includes the adjustment layers 17 (17-1, 17-2, 17-3) that are provided partly on the second layer 15. The residual stress of the adjustment layers 17 is relatively less than that of the beam portion 16C. In other words, the adjustment layers 17 have a greater compressive property than the second layer 15. For example, the adjustment layers 17 have compressive stress.

Thereby, the segments of the cantilever 16, where the adjustment layers 17-1, 17-2 and 17-3 are provided, have warps in the reversed direction. Specifically, the segments of the cantilever 16, where the adjustment layers 17-1, 17-2 and 17-3 are provided, have convex shapes, and the segments of the cantilever 16, where the adjustment layers 17-1, 17-2 and 17-3 are not provided, have concave shapes.

The convex segment (convex portion 16A) has such a stress gradient as to provide a convex warp. The concave segment (concave portion 16B) has such a stress gradient as to provide a concave warp. As is shown in FIG. 3, the cantilever 16 is configured such that a plurality of convex portions 16A and a plurality of concave portions 16B are alternately arranged.

If the length of one unit comprising one concave portion and one convex portion of the cantilever 16 is sufficiently reduced while the ratio in length between the convex portion 16A and concave portion 16B is being fixed (adjusted), it is possible to form the cantilever 16 having a substantially flat shape as a whole. In other words, the cantilever 16 is substantially parallel to the substrate 11. The cantilever 16 with the substantially flat shape, in this context, refers to the cantilever 16 which is not perfectly flat but extends in a predetermined direction when the entirety of the cantilever 16 is viewed.

The method of forming the adjustment layers is not limited. For example, a layer with compressive stress is formed on the second layer 15, and this layer is partly etched away. Thereby, adjustment layers 17-1, 17-2 and 17-3 are formed. Alternatively, adjustment layers 17-1, 17-2 and 17-3 may partly be formed on the second layer 15 by a lift-off method.

Figure 4:
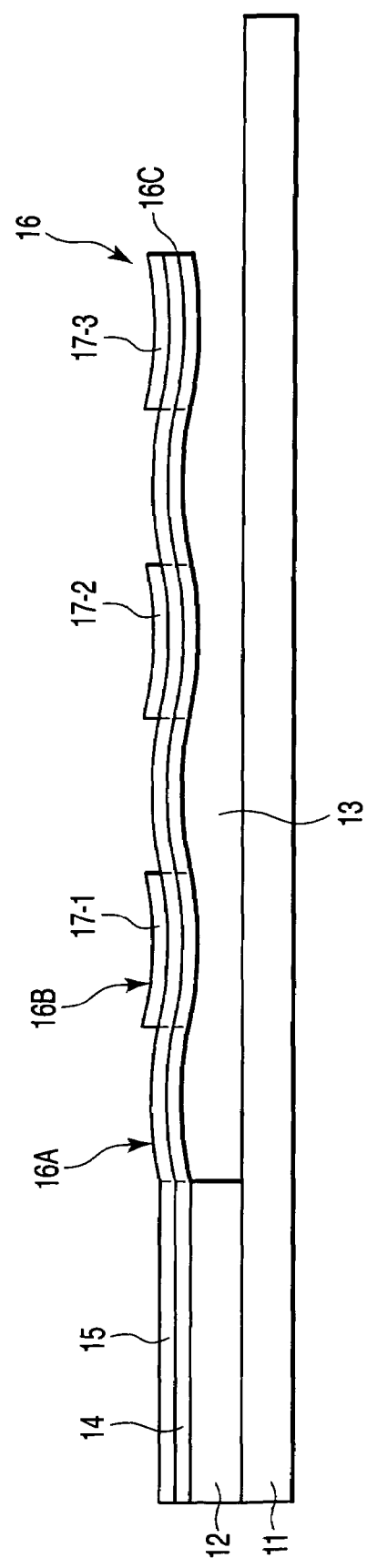
FIG. 4 is a cross-sectional view showing another example of the structure of a cantilever that is composed of a plurality of layers.

In the meantime, it is possible to substantially flatten a beam portion 16C which warps downward. FIG. 4 is a cross-sectional view showing another example of the structure of a cantilever that is composed of a plurality of layers.

The residual stress of the second layer 15 is relatively less than that of the first layer 14. In other words, the second layer 15 has a higher compressive property than the first layer 14. For example, the first layer 14 has a tensile stress and the second layer 15 has a compressive stress. Thereby, a beam portion 16C formed of the first layer 14 and second layer 15 has such a stress gradient as to provide a convex warp. Accordingly, the beam portion 16C warps downward.

The cantilever 16 includes the adjustment layers 17 (17-1, 17-2, 17-3) that are provided partly on the second layer 15. The residual stress of the adjustment layers 17 is relatively greater than that of the beam portion 16C. For example, the adjustment layers 17 have tensile stress.

Thereby, the segments of the cantilever 16, where the adjustment layers 17-1, 17-2 and 17-3 are provided, have warps in the reversed direction. Specifically, the segments of the cantilever 16, where the adjustment layers 17-1, 17-2 and 17-3 are not provided, have convex shapes, and the segments of the cantilever 16, where the adjustment layers 17-1, 17-2 and 17-3 are provided, have concave shapes. As is shown in FIG. 4, the cantilever 16 is configured such that a plurality of convex segments (convex portions 16A) and a plurality of concave segments (concave portions 16B) are alternately arranged.

If the length of one unit comprising one concave portion and one convex portion of the cantilever 16 is sufficiently reduced while the ratio in length between the convex portion 16A and concave portion 16B is being fixed, it is possible to form the cantilever 16 which is substantially flat as a whole and is substantially parallel to the substrate. This method is also applicable to a beam that is fixed at both ends.

Figure 5:
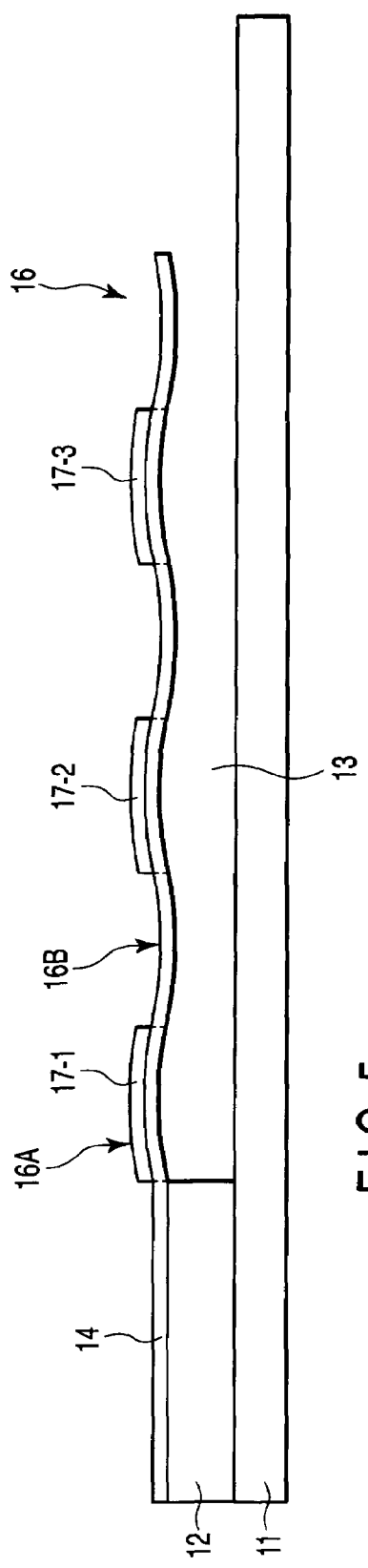
FIG. 5 is a cross-sectional view showing the structure of a cantilever that is composed of a single layer.

It is also possible to substantially flatten a cantilever that is composed of a single layer. FIG. 5 is a cross-sectional view showing the structure of a cantilever that is composed of a single layer.

A first layer 14 is provided over the anchor 12 and cavity 13. Even in the case where the beam has a single-layer structure and not the two-layer structure, the beam warps if the single layer has a stress gradient in its film thickness direction. In the film thickness direction, the upper part of the first layer 14 has a greater residual stress than the lower part thereof. In this case, the first layer 14 warps upward.

The cantilever 16 includes the adjustment layers 17 (17-1, 17-2, 17-3) that are provided partly on the first layer 14. The residual stress of the adjustment layers 17 is relatively less than that of the first layer 14. Accordingly, the convex portions 16A and concave portions 16B are alternately repeatedly arranged, and the cantilever 16 can substantially be flattened.

Figure 6:
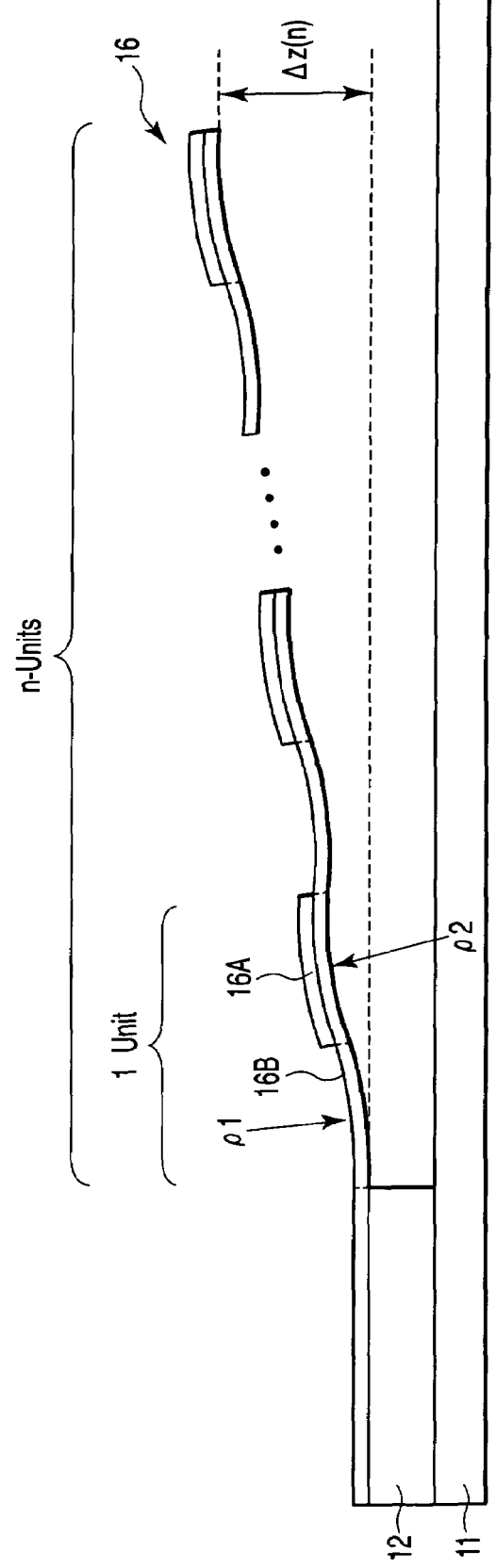
FIG. 6 is a cross-sectional view for explaining the setting of a ratio in length between a concave portion and a convex portion.

Next, a description is given of the method of setting the ratio in length between the concave portion and convex portion. FIG. 6 is a cross-sectional view for explaining the setting of the ratio in length between the concave portion and convex portion. One convex portion 16A and one concave portion 16B constitute one unit. Consider a cantilever 16 with a length L corresponding to n-units of convex and concave portions. It is assumed that the radius of curvature of the concave portion 16B is $\rho_1$, the radius of curvature of the convex portion 16A is $\rho_2$, the total length of concave portions 16B is L1, and the total length of convex portions 16A is L2 (that is, L=L1+L2). In addition, it is assumed that $\theta_1 = L1/\rho_1$, $\theta_2 = L2/\rho_2$, and $\phi = (\theta_1 - \theta_2)/2$.

In this case, the warpage $\Delta z(n)$ of the cantilever is expressed by formula (4).

$$\Delta Z(n) = \frac{2\sin\phi}{\sin(\phi/n)} \left[ \rho_1 \sin\left(\frac{\theta_1}{2n}\right) \sin\left(\frac{\theta_2}{2n} + \phi\right) + \rho_2 \sin\left(\frac{\theta_2}{2n}\right) \sin\left(\frac{\theta_1}{2n} + \phi\right) \right] \quad (4)$$

If n is sufficiently large, formula (4) converges to formula (5).

$$\Delta Z(\infty) = \frac{L}{\phi} \sin^2\phi \quad (5)$$

The right side of formula (5) is 0 when $L1/L2 = \rho_1/\rho_2$. This means that if the ratio in length between the concave portion and convex portion is made equal to the ratio in radius of curvature, the warp of the beam can substantially be eliminated.

In fact, since n takes a finite value, the state, which is expressed by formula (5) itself, is not obtained. However, by using microfabrication technology of semiconductor devices, it is possible to sufficiently reduce the length of one unit of concave and convex portions, relative to the length L of the cantilever. It is thus considered that formula (5) is established with sufficiently good approximation.

The warpage of one unit of concave and convex portions is proportional to $(Li/n)2/(2\rho i)$, (i=1, 2), that is, the square of $Li/n$ of the minimum unit. Accordingly, when the n is sufficiently large, the concave/convex irregularities on the lower surface of the cantilever are practically eliminated, and the lower surface becomes substantially flat. For example, in the case of applying this beam structure to an electrode layer of a variable capacitor, the length of the beam that forms the electrode layer is about 100 μm. On the other hand, the length $Li/n$ of the minimum unit of the concave portion and convex portion can be set at about 1 μm. Hence, the surface of the electrode layer, which forms the variable capacitor, becomes substantially flat. A specific structure of the variable capacitor will be described later.

Figure 7:
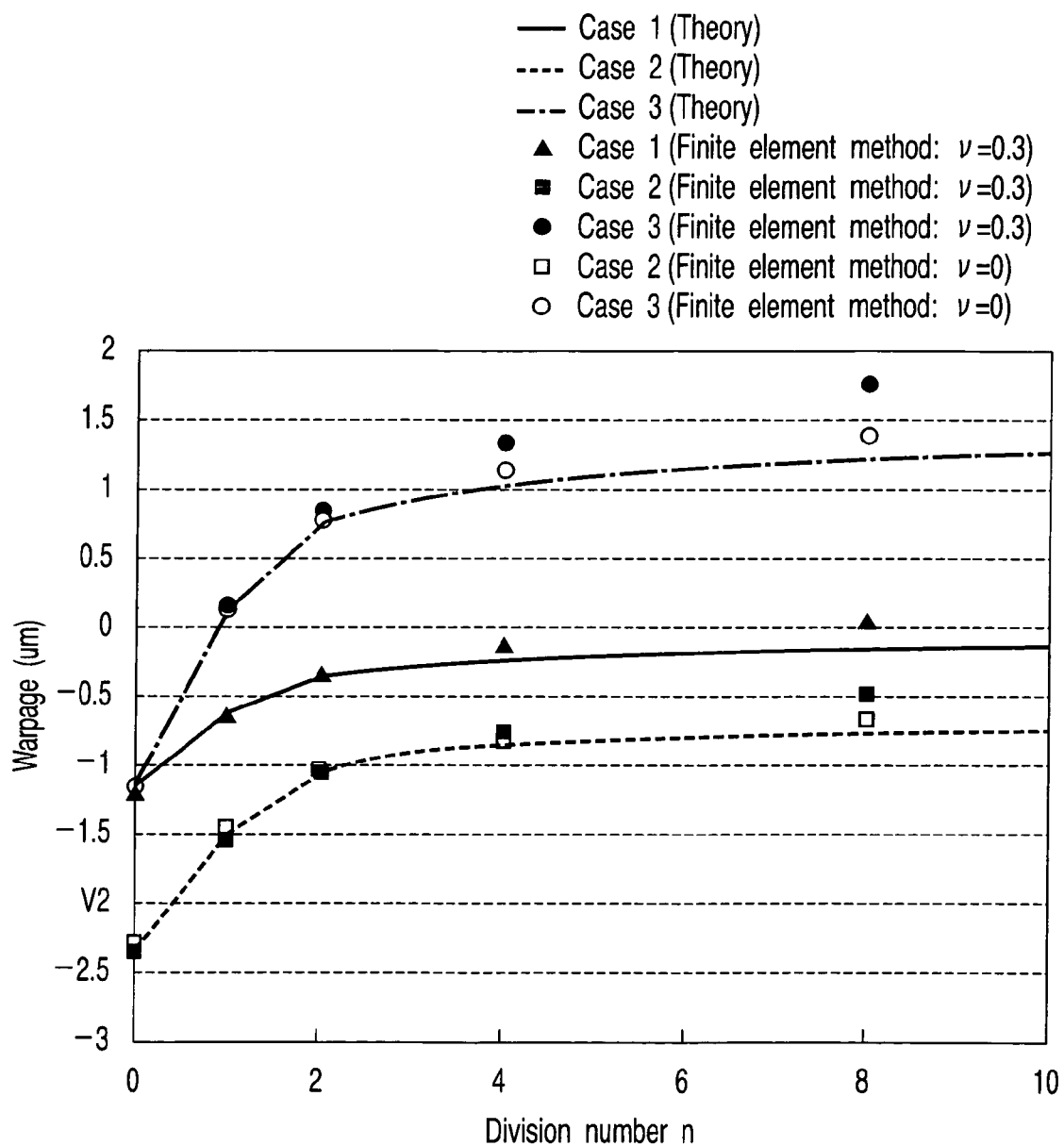
FIG. 7 shows a simulation result of warpage of a cantilever by a finite element method.

FIG. 7 shows a simulation result of warpage of a cantilever by a finite element method. FIG. 8 is a table showing conditions of three cases (case 1 to case 3) of cantilevers shown in FIG. 7. FIG. 9 is a perspective view illustrating a warp of the cantilever, which is calculated by the finite element method.

A typical Poisson's ratio ν of the material of the cantilever, which is used in MEMS, is about 0.3. Thus, FIG. 7 shows simulation results by the finite element method when Poisson's ratio ν=0.3, simulation results by the finite element method when Poisson's ratio ν=0, and theoretical values calculated based on the theoretical formula (formula (5)) with respect to the three cases shown in FIG. 8. In FIG. 7, the abscissa indicates a division number (i.e. the number of units each comprising a concave portion and a convex portion) of the cantilever, and the ordinate indicates warpage (μm).

In FIG. 7, the theoretical values have a uniform tendency. However, since the effect of the Poisson's ratio is not taken into account, the error increases as the division number n becomes greater. FIG. 10 shows warpage of the theoretical value and warpage based on the finite element method (Poisson's ratio ν=0.3). In FIG. 10, the abscissa indicates $\rho 1/\rho 2$ and the ordinate indicates warpage (μm).

As is shown in FIG. 10, $\rho 1/\rho 2$, at which warpage becomes zero, is 0.8 in theoretical value, but it is 1.1 in the finite element method in which the Poisson's ratio is taken into account. There is an error of 38% between both values. Considering the fact that the error increases as the division number is increased and that there are materials with the Poisson's ratio of 0.3 or more, it should be regarded that there is an error of about ±40% in the theoretical formula. Thus, also in the case of determining L1/L2 from $\rho 1/\rho 2$, it should be regarded that an error of up to about ±40% is tolerable.

The above discussions are based on two-dimensional models. A three-dimensional effect of the beam, that is, the effect in the depth direction, is not taken into account. Formula (4) and formula (5) are effective with respect to a beam with a small width, that is, a beam with a small dimension in the depth direction, but the degree of approximation is not good with respect to a beam with a large width. However, the concept that the warp is eliminated by repeatedly arranging concave and convex portions is still effective. Thus, with respect to the beam with a large width, the ratio between the concave portion and convex portion should be adjusted in consideration of the planar pattern of the film on which the concave or convex portions are formed.

Figure 11:
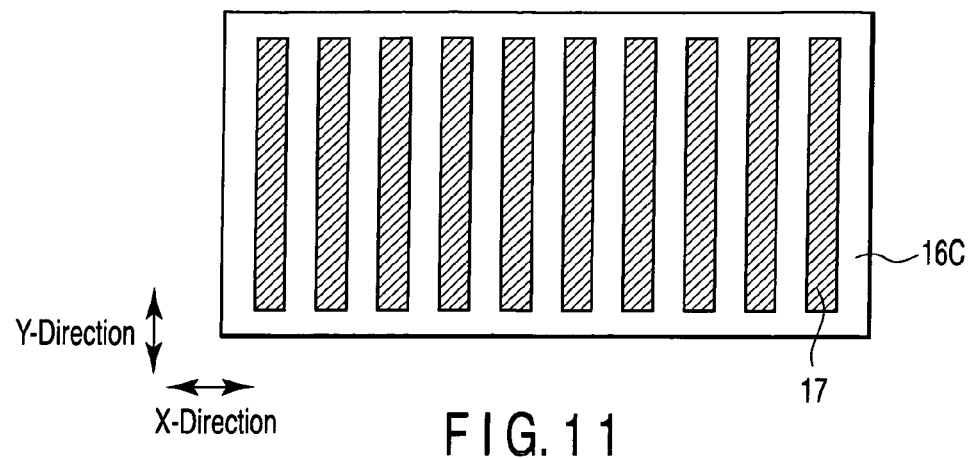
FIG. 11 is a plan view showing a first example of a planar pattern of an adjustment layer 17 for adjusting a warp of a beam.

Examples of the planar pattern of the adjustment layer 17 for adjusting the warp of the beam will be described below. FIG. 11 is a plan view showing a first example of the planar pattern of the adjustment layer 17. The beam portion 16C (comprising first layer 14 and second layer 15) extends in an X-direction and has a predetermined width (length in Y-direction), and has, e.g. a rectangular planar shape. The adjustment layer 17 for adjusting the warp of the beam portion 16C is provided on the beam portion 16C.

The adjustment layer 17 has a stripe shape. Specifically, the adjustment layer 17 comprises a plurality of adjustment layer portions. Each of the adjustment layer portions linearly extends in the Y-direction. Each adjustment layer portion has a predetermined width (length in X-direction). This predetermined width corresponds to the length of the above-mentioned concave portion or convex portion. In addition, the interval between two neighboring adjustment layer portions corresponds to the length of the concave portion or convex portion. By forming the adjustment layer 17 in the stripe shape, the warp of the beam having a great width can be adjusted.

Figure 12:
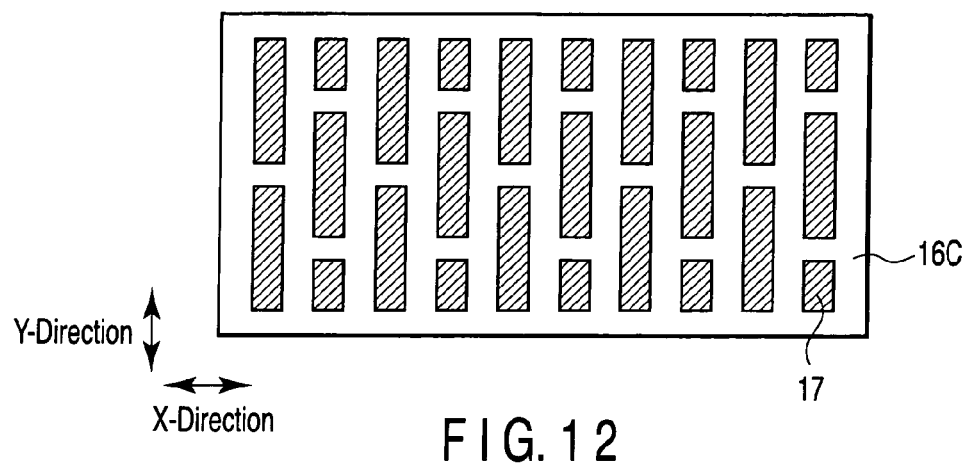
FIG. 12 is a plan view showing a second example of the planar pattern of the adjustment layer 17.

FIG. 12 shows a second example of the planar pattern of the adjustment layer 17. The second example is a modification of the first example. The adjustment layer 17 of the second example has a brick-like arrangement. Specifically, in this adjustment layer 17, each adjustment layer portion shown in the first example is separated at one or more points. In the example of FIG. 12, adjustment layer portions, each of which is separated at one point, and adjustment layer portions, each of which is separated at two points, are alternately arranged. The width of the part where the adjustment layer portion is separated is equal to, for example, the interval of two neighboring adjustment layer portions.

As the length of a layer that extends linearly increases, a warp tends to easily occur at the part where the layer is disposed. Thus, as shown in the second example, by separating the adjustment layer portion with an arbitrary length, the length of the adjustment layer portion in the Y-direction is reduced. Thereby, compared to the first example, the warp of the beam in the Y-direction can be reduced.

Figure 13:
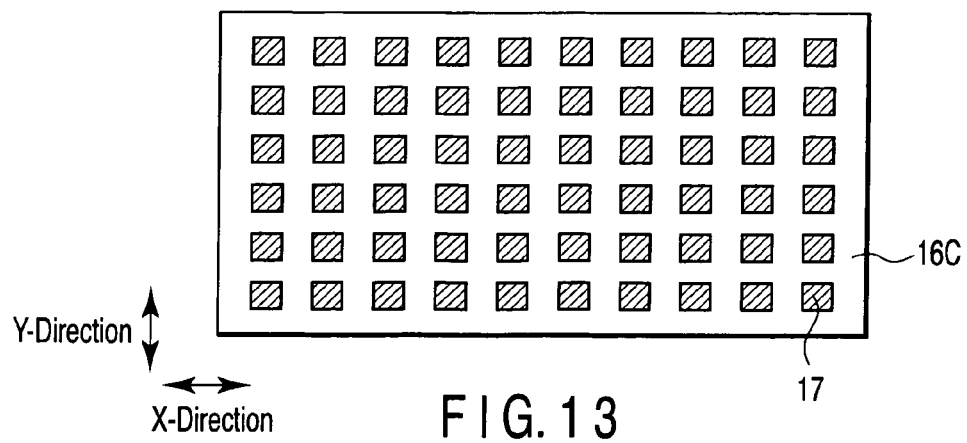
FIG. 13 is a plan view showing a third example of the planar pattern of the adjustment layer 17.

FIG. 13 shows a third example of the planar pattern of the adjustment layer 17. In the adjustment layer 17 of the third example, the beam portion 16C is arranged so as to have a lattice shape, when the beam 16 is viewed from above. Specifically, the adjustment layer 17 is composed of a plurality of adjustment layer portions, and each adjustment layer portion has, e.g. a square shape. The plural adjustment layer portions are arranged at predetermined intervals in the X-direction and Y-direction. In the third example, compared to the second example, the warp of the beam in the Y-direction can further be reduced.

Figure 14:
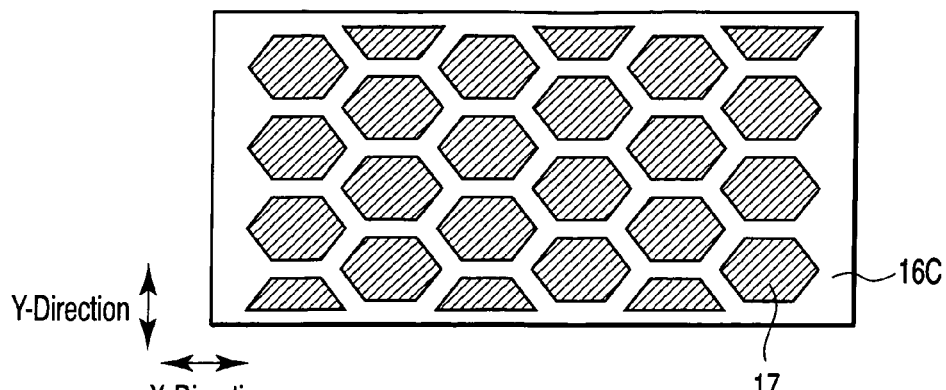
FIG. 14 is a plan view showing a fourth example of the planar pattern of the adjustment layer 17.

FIG. 14 shows a fourth example of the planar pattern of the adjustment layer 17. The adjustment layer 17 of the fourth example has a honeycomb shape. Specifically, the adjustment layer 17 comprises a plurality of adjustment layer portions, and each adjustment layer portion has, e.g. a hexagonal shape. The adjustment layer portions are arranged such that the interval between two opposed sides of two neighboring adjustment layer portions is equal.

Figure 15:
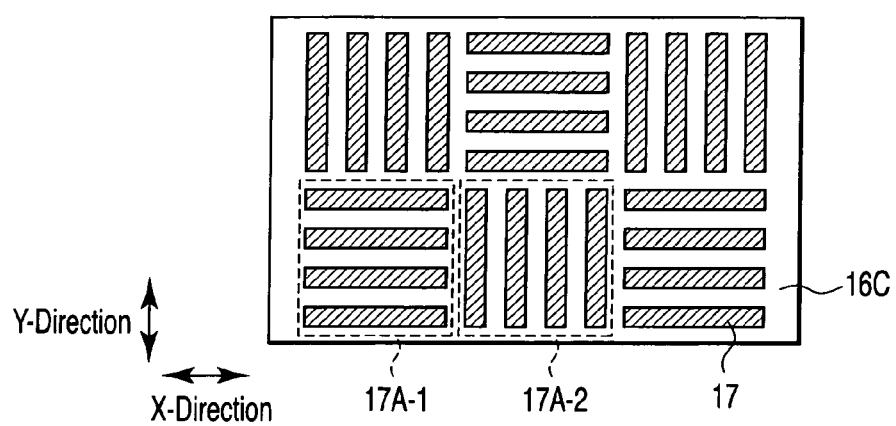
FIG. 15 is a plan view showing a fifth example of the planar pattern of the adjustment layer 17.

FIG. 15 shows a fifth example of the planar pattern of the adjustment layer 17. The adjustment layer 17 of the fifth example has a tile-like arrangement. Specifically, the adjustment layer 17 is composed of a plurality of tiles 17A, and each tile 17A has a stripe shape. Each tile 17A is composed of a plurality of adjustment layer portions each extending linearly.

Further, the tiles 17A include first tiles 17A-1 in which a plurality of linear adjustment layer portions that form the tiles 17A extend in the X-direction, and second tiles 17A-2 in which a plurality of linear adjustment layer portions that form the tiles 17A extend in the Y-direction. The first titles 17A-1 and second tiles 17A-2 are alternately arranged in the X-direction and Y-direction, thereby constituting the adjustment layer 17 having the tile-like arrangement.

In the fifth example, the length of each adjustment layer portion is small, and it is thus possible to reduce warpage of the beam due to the adjustment layer portion. In addition, the beam portion 16C, where the adjustment layer portions are not provided, hardly extends in a linear continuous shape. Therefore, warpage of the beam portion 16C can be reduced.

Figure 16:
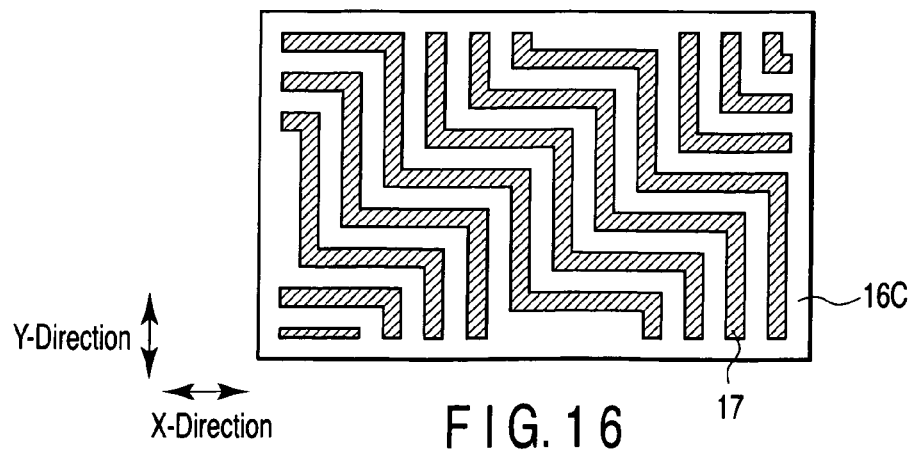
FIG. 16 is a plan view showing a sixth example of the planar pattern of the adjustment layer 17.

FIG. 16 shows a sixth example of the planar pattern of the adjustment layer 17. The adjustment layer 17 of the sixth example has a zigzag shape. Specifically, the adjustment layer 17 comprises a plurality of adjustment layer portions, and each adjustment layer portion has a zigzag shape. Each adjustment layer portion is disposed with a predetermined interval from a neighboring adjustment layer portion.

In the fourth and sixth examples of the first to sixth examples of the planar patterns of the adjustment layers 17, the concave or convex portion does not linearly extend over a long distance at any location except outer peripheral regions. In the fourth and sixth examples, when the beam is cut in an arbitrary direction, the adjustment layer 17 is always present. Thus, the warp on the surface, as a whole, can effectively be eliminated. Also in the fifth example, as mentioned above, the area of the linearly continuously extending layer is small, and thus the warp on the surface, as a whole, can effectively be eliminated.

On the other hand, in the case of the planar patterns of the first to third examples, compared to the fourth to sixth examples, the warp on the surface tends to easily occur. However, in the case where the length of the beam in the X-direction or Y-direction is not so large, the warp can sufficiently be suppressed. If the warp in the Y-direction is to be intentionally caused, the planar patterns of the first to third examples may be adopted.

That the layout pattern of the adjustment layer 17 can adjust the warp means that the degree of freedom for adjustment of the warp is increased. In the prior art, the warp of the beam is adjusted by controlling the film thickness or stress. In this invention, a new parameter for warp adjustment, that is, the dense/non-dense formation of concave/convex portions, is added.

Making use of the increased degree of freedom, the temperature dependency of warpage of the beam can also be reduced. Specifically, the temperature dependency of warpage can be reduced by setting the film thickness and L1/L2 so as to establish, $$L1/L2 = \rho1(T)/\rho2(T) = \rho1(T+\Delta T)/\rho2(T+\Delta T)$$

where $\rho1(T)$ and $\rho2(T)$ are the radii of curvature of the concave portion and convex portion at temperature T, respectively.

It is noted that the warpage of a beam can be controlled by alternately repeatedly arranging, within the beam, layer structures having opposite directions of warps in the embodiment of the present invention. In particular, it is demonstrated that the warp of the beam can be reduced by optimizing the ratio in length between the concave portion and convex portion in accordance with the radii of curvature of the concave portion and convex portion. Accordingly to this method, it is possible to control a warp of a beam comprising an arbitrary number of layers, as well as the beam comprising two layers.

Furthermore, the warp on the whole plane of a beam with a large width can be reduced by devising the planar pattern of the adjustment layer 17.

The present embodiment is directed to the cantilever. However, in this embodiment, the cantilever may be interpreted as a beam that is a structure composed of a layer structure disposed over a cavity. The present embodiment may also applicable to a shell that refers to a structure having a width. Hence, in the present specification, the term "beam" should be interpreted to include both concepts of "beam" and "shell". The same applies to other embodiments to be described below.

SECOND EMBODIMENT

As described above, that the warp can be adjusted by the dense/non-dense formation of concave/convex portions means that the degree of freedom for adjustment of the warp is increased. Taking advantage of this, the height of the cantilever can be adjusted. In a second embodiment of the invention, the height of the cantilever is adjusted by making use of the concave portions or convex portions that form the cantilever.

Figure 17:
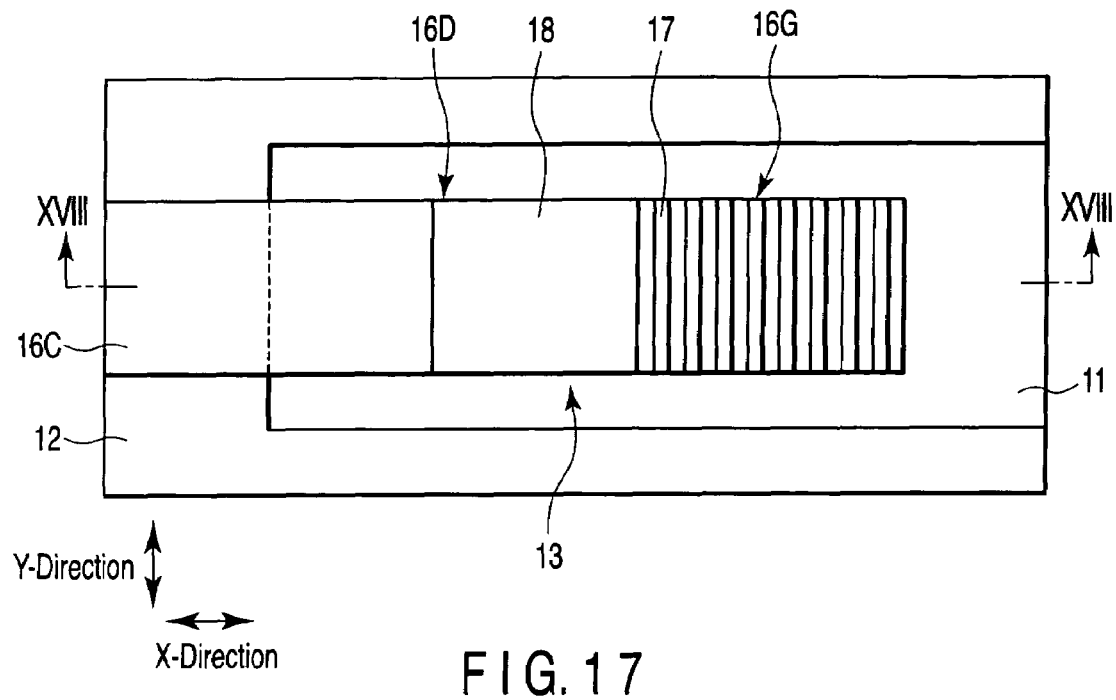
FIG. 17 is a plan view of a device comprising a cantilever according to a second embodiment of the invention.
Figure 18:
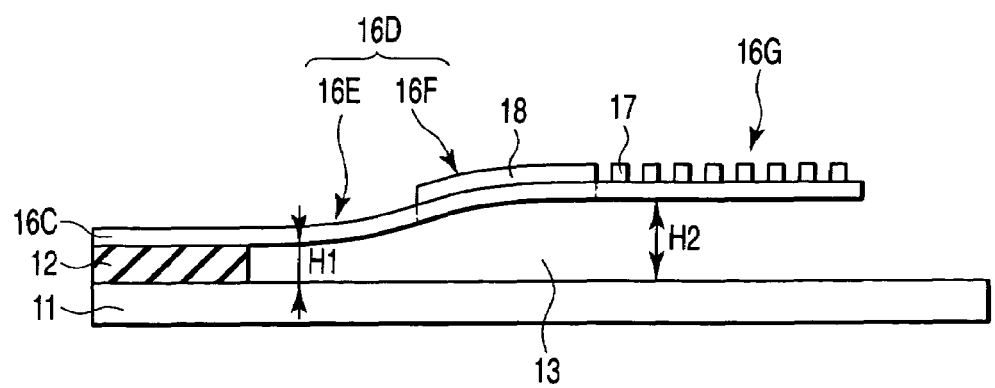
FIG. 18 is a cross-sectional view of the device, taken along line XVIII-XVIII in FIG. 17.

FIG. 17 is a plan view of a device comprising a cantilever according to the second embodiment of the invention. FIG. 18 is a cross-sectional view of the device, taken along line XVIII-XVIII in FIG. 17.

A cantilever 16 is provided over an anchor 12 and a cavity 13. The cantilever 16 includes a beam portion 16C and a plurality of adjustment layers 17 and 18 which are provided partly on the beam portion 16C. In addition, the cantilever 16 is composed of a base portion 16G that extends in the X-direction and a support portion 16D that supports the base portion 16G.

In the state in which the adjustment layer is not provided, the beam portion 16C warps upward. A plurality of adjustment layers 17 for adjusting a warp are provided on that part of the beam portion 16C, which corresponds to the base portion 16G. The adjustment layer 17 has an optimal length for substantially flattening the base portion 16G (refer to the first embodiment). Thus, the base portion 16G is substantially flat.

An adjustment layer 18 is provided on that part of the beam portion 16C, which corresponds to the support portion 16D. The residual stress of the adjustment layer 18 is relatively smaller than that of the beam portion 16C. For example, the adjustment layer 18 has a compressive stress. Thereby, the segment of the support portion 16D, where the adjustment layer 18 is provided, has the warp in the reversed direction. Specifically, the segment of the support portion 16D, where the adjustment layer 18 is provided, has a convex shape, and the segment of the support portion 16D, where the adjustment layer 18 is not provided, has a concave shape.

The convex segment (convex portion 16F) has such a stress gradient as to provide a convex warp. The concave segment (concave portion 16E) has such a stress gradient as to provide a concave warp. The length of the adjustment layer 18 in the X-direction is greater than the length of one adjustment layer 17 in the X-direction. That is, the length of one unit comprising the concave portion and convex portion is greater in the support portion 16D than in the base portion 16G.

In this manner, by making use of the warp of the beam, the support portion 16D can adjust the height of the base portion 16G. As shown in FIG. 18, the height H2 of the extension part 16G (i.e. height of the cavity under the base portion 16G) is greater than the height H1 of the cantilever 16 on the anchor 12 side. The height H1 of the cavity 13 is equal to the thickness of the anchor 12. The height H2 can arbitrarily be varied by adjusting the length of the concave portion 16E and convex portion 16F.

As has been described above in detail, by varying the length of the concave portion and convex portion from location to location, the height of the cavity 13 can be adjusted. Hence, even in the case where a sacrificial layer for use in formation of the cavity 13 is thin, the height of the cavity 13 can be increased.

In addition, by thinning the sacrificial layer, the film-formation process of the sacrificial layer can be simplified and the time for removing the sacrificial layer can be shortened. Thereby, the manufacturing cost can be reduced.

THIRD EMBODIMENT

An actuator, in usual cases, is formed by stacking a plurality of layers. The actuator is a device for converting energy, such as electrical energy or chemical energy, to dynamical kinetic energy, thus performing a mechanical work. A third embodiment of the invention relates to an example in which the present invention is applied to a piezoelectric type actuator.

Figure 19:
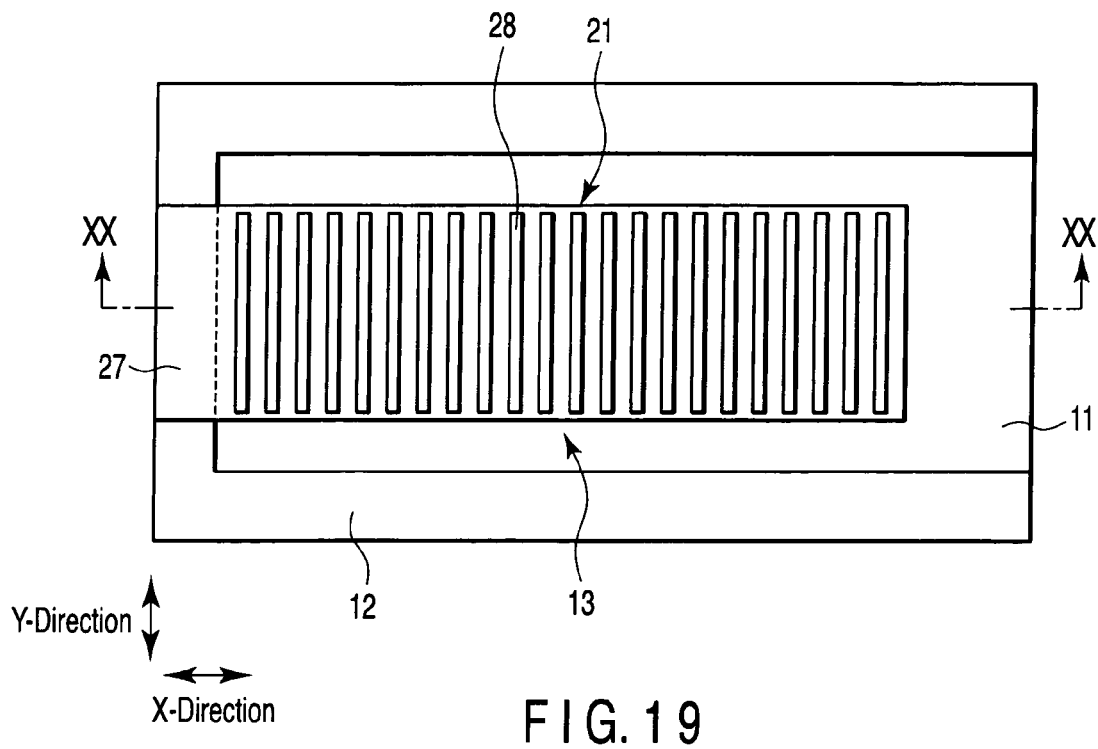
FIG. 19 is a plan view of a semiconductor device according to a third embodiment of the present invention.
Figure 20:
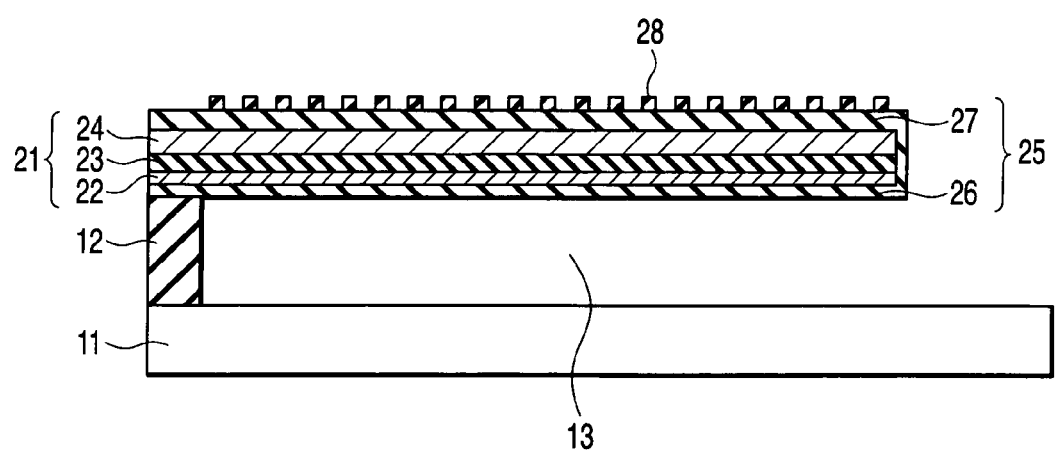
FIG. 20 is a cross-sectional view of the semiconductor device, taken along line XX-XX in FIG. 19.

FIG. 19 is a plan view of a semiconductor device according to the third embodiment of the invention. FIG. 20 is a cross-sectional view of the semiconductor device, taken along line XX-XX in FIG. 19.

An anchor 12 is provided on a substrate 11. A semiconductor substrate, for instance, is used as the substrate 11. Examples of the material of the semiconductor substrate include an intrinsic semiconductor such as Si or Ge, a compound semiconductor such as GaAs or ZnSe, and a high-conductivity semiconductor which is obtained by doping impurities in these semiconductors. The semiconductor substrate may be an SOI (silicon on insulator) substrate or a glass substrate.

The anchor 12 is formed of an insulating material (e.g. $SiO_2$). The anchor 12 is provided partly on the substrate 11. A cavity 13 for allowing movement of an actuator 21 (to be described later) is provided in the anchor 12. The depth of the cavity 13 can be adjusted, for example, by the film thickness of the anchor 12.

An actuator 21, which is covered with an insulating layer 25, is provided over the anchor 12 and cavity 13 so as to extend in the X-direction. Specifically, the insulating layer 25 includes a lower insulation layer 26 and an upper insulation layer 27. The lower insulation layer 26 is provided over the anchor 12 and cavity 13. The actuator 21 is provided on the lower insulation layer 26. The upper insulation layer 27 is provided on the actuator 21. Examples of the material of the insulating layer 25 include $SiO_2$ and alumina.

The actuator 21 is composed of, e.g. a piezoelectric element. The actuator 21 includes a lower electrode layer 22, an upper electrode layer 24, and a piezoelectric layer 23 interposed between the lower electrode layer 22 and upper electrode layer 24. The planar shape of the actuator 21 is, for example, rectangular, or it may be any other shape.

The material of the lower electrode layer 22 and upper electrode layer 24 of the actuator 21 is, for instance, (a) one selected from the group consisting of Pt, Sr, Ru, Cr, Mo, W, Ti, Ta, Al, Cu and Ni, (b) a nitride including at least one selected from the above-mentioned group, (c) an conductive oxide (e.g. SrRuO) including at least one selected from the above-mentioned group, or (d) a stack of materials selected from (a) to (c).

The material of the piezoelectric layer 23 of the actuator 21 is, for instance, a ceramic piezoelectric material such as PZT ($PbZr_xTi_{1-x}O_3$), AlN, ZnO, PbTiO or BTO ($BaTiO_3$), or a high-polymer piezoelectric material such as PVDF (polyvinylidene fluoride).

The insulating layer 25 functions to protect the piezoelectric layer and electrode layers at the time of etching a sacrificial layer, which is included in the step of forming the cavity 13. The insulating layer 25 may not be provided, if the piezoelectric layer and electrode layers suffer no damage at the time of etching.

Since the actuator 21 is composed of a plurality of layers, the warp tends to easily occur in the actuator 21. The actuator 21 is thus provided with an adjustment layer 28 for adjusting concave and convex portions, thereby adjusting the warp of the actuator 21. A plurality of adjustment layers 28 for adjusting concave and convex portions are provided partly on the upper insulation layer 27. The adjustment layer 28 has, for example, a stripe shape. Needless to say, the adjustment layer 28 may have other planar patterns as described in the first embodiment.

In the present embodiment, the actuator 21 warps upward. The actuator 21, in this embodiment, refers to a cantilever including the insulating layer 25. Specifically, determination is made on the basis of whether the cantilever comprising the actuator 21 and insulating layer 25 warps upward or downward. The adjustment layer 28, which is used here, has a relatively lower residual stress than the actuator 21. The adjustment layer 28 is formed of, e.g. $SiO_2$ having compressive stress.

Thereby, the segments of the actuator 21, where the adjustment layer 28 is provided, have warps in the reversed direction. Specifically, the segments of the actuator 21, where the adjustment layer 28 is provided, have convex shapes, and the segments of the actuator 21, where the adjustment layer 28 is not provided, have concave shapes.

If the length of one unit comprising one concave portion and one convex portion of this beam structure is sufficiently reduced while the ratio in length between the convex portion and concave portion is being fixed, it is possible to form the actuator 21 having a substantially flat shape as a whole. In the case where the actuator 21 warps downward, an adjustment layer, which has a relatively greater residual stress than the actuator 21, is used.

A passivation layer, for instance, may be used as the adjustment layer 28 for adjusting concave and convex portions. The passivation layer is an insulating layer that is used to protect the surface of a semiconductor chip. The passivation layer is eliminated at an opening for an electrode pad in order to secure electrical conductivity with a bonding terminal (that is, a mask for a passivation process is already provided).

Thus, if the passivation layer is used as the layer for adjusting concave and convex portions, the warp of the actuator 21 can be adjusted without increasing the number of process steps and the number of masks. In the case of using a passivation layer having a compressive stress, it should suffice if the actuator 21 is set to warp downward in the state in which the passivation layer is not provided.

FOURTH EMBODIMENT

In a fourth embodiment of the invention, the warp of the actuator 21 is adjusted by making use of a wiring layer that is provided on the insulating layer 25.

Figure 21:
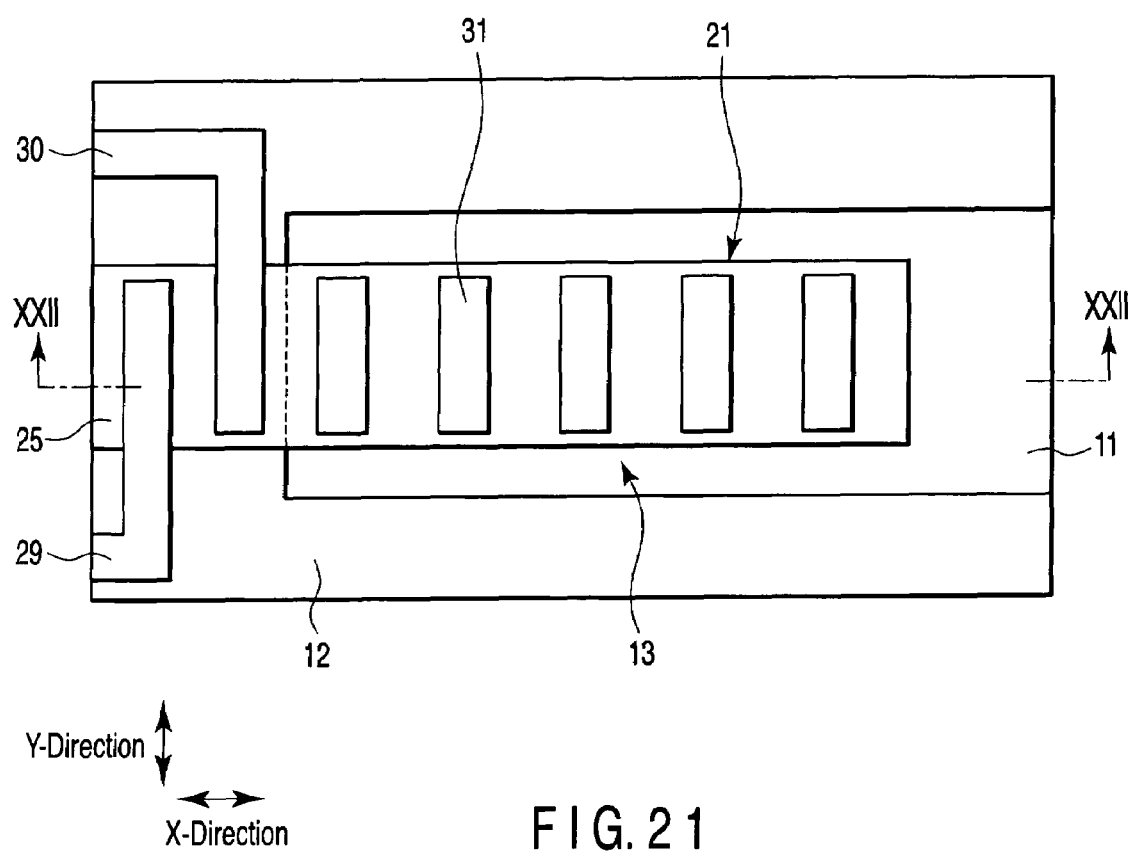
FIG. 21 is a plan view of a semiconductor device according to a fourth embodiment of the present invention.
Figure 22:
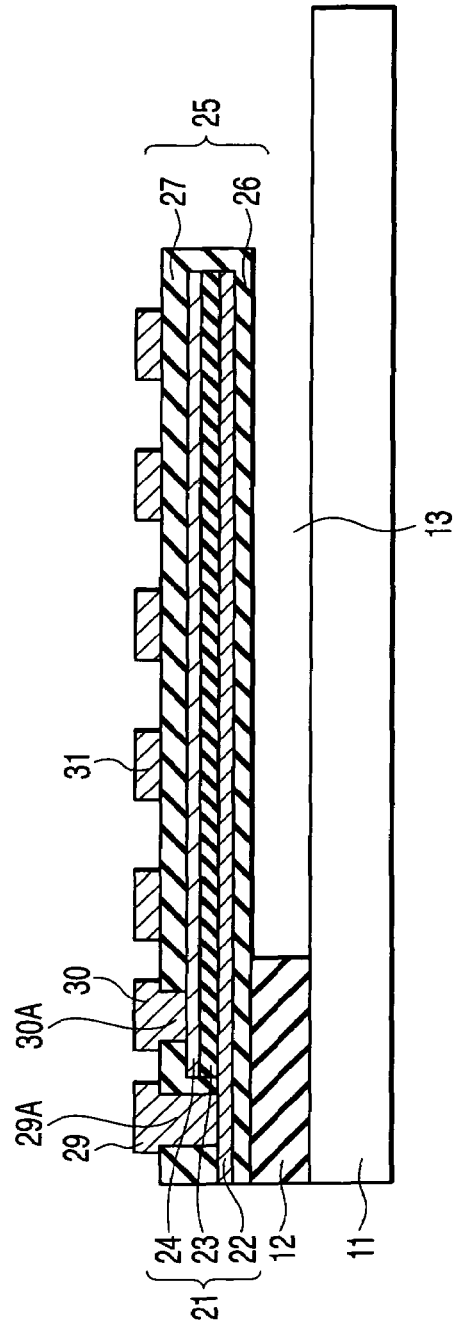
FIG. 22 is a cross-sectional view of the semiconductor device, taken along line XXII-XXII in FIG. 21.

FIG. 21 is a plan view of a semiconductor device according to the fourth embodiment of the present invention. FIG. 22 is a cross-sectional view of the semiconductor device, taken along line XXII-XXII in FIG. 21.

A contact layer 29A, which is electrically connected to the lower electrode layer 22, is provided on the lower electrode layer 22 and within the upper insulation layer 27. A wiring layer 29, which is electrically connected to the contact layer 29A, is provided on the upper insulation layer 27. A voltage V1 for moving the actuator 21 is supplied to the wiring layer 29.

A contact layer 30A, which is electrically connected to the upper electrode layer 24, is provided on the upper electrode layer 24 and within the upper insulation layer 27. A wiring layer 30, which is electrically connected to the contact layer 30A, is provided on the upper insulation layer 27. A voltage V2 for moving the actuator 21 is supplied to the wiring layer 30.

A plurality of dummy wiring layers 31 are provided at predetermined intervals on the upper insulation layer 27 above the cavity 13. Each of the dummy wiring layers 31 is provided so as to extend in the Y-direction. Specifically, the dummy wiring layers 31 have stripe shapes.

In the present embodiment, the actuator 21 warps downward. The direction of the warp of the actuator 21 varies depending on the material and thickness of the upper electrode layer 24 and lower electrode layer 22 that constitute the actuator 21, or the material and thickness of the piezoelectric layer 23. The dummy wiring layers 31, which are used here, have a relatively greater residual stress than the actuator 21. As the material of the dummy wiring layers 31, Al with a tensile stress is used, for instance.

Thereby, the segments of the actuator 21, where the dummy wiring layers 31 are provided, have warps in the reversed direction. Specifically, the segments of the actuator 21, where the dummy wiring layers 31 are not provided, have convex shapes, and the segments of the actuator 21, where the dummy wiring layers 31 are provided, have concave shapes. The warpage of the actuator 21 can be adjusted by adjusting the width of each dummy wiring layer 31 (i.e. length in X-direction) and the intervals of dummy wiring layers 31.

Figure 23:
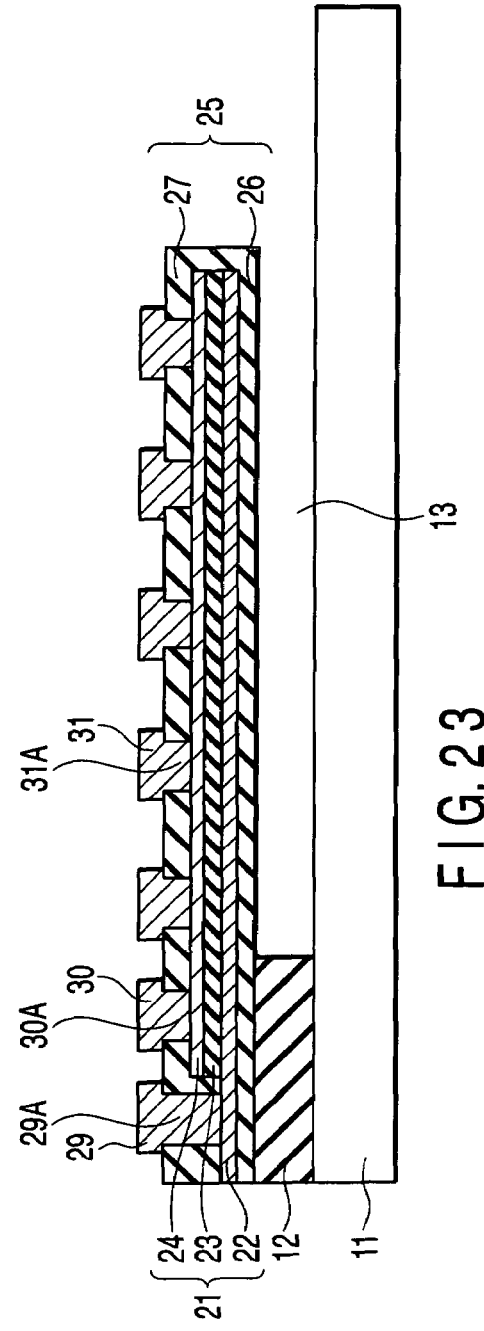
FIG. 23 is a cross-sectional view showing a modification of the fourth embodiment.

Next, a modification of the fourth embodiment is described. FIG. 23 is a cross-sectional view showing the modification. The plan view of the modification is the same as FIG. 21, so it is omitted here.

A plurality of dummy contact layers 31A, which are provided in association with the respective dummy wiring layers 31 and electrically connect the dummy wiring layers 31 and the upper electrode layer 24, are provided on the upper electrode layer 24 and within the upper insulation layer 27. The length of the dummy contact layer 31A in the Y-direction is equal to the length of the dummy wiring layer 31 in the Y-direction.

In the case where the upper insulation layer 27 is formed of a layer of, e.g. $SiO_2$ with compressive stress and the dummy contact layers 31A are formed of layers of, e.g. Al with tensile stress, the segments of the actuator 21, where the upper insulation layer 27 is provided, have convex shapes and the segments of the actuator 21, where the dummy contact layers 31A are provided, have concave shapes. In this manner, the warp of the actuator 21 can be adjusted.

As has been described above in detail, the warp of the actuator 21 can be adjusted by using the wiring layers provided over the actuator 21. Moreover, the warp of the actuator 21 can be adjusted by using the contact layers provided on the actuator 21.

Furthermore, making use of the fabrication steps of forming the wiring layers 29 and 30, the dummy wiring layers or dummy contact layers can be formed. There is no need to provide additional fabrication steps of forming adjustment layers for adjusting the warp of the actuator 21. Thereby, an increase in manufacturing cost can be suppressed.

FIFTH EMBODIMENT

Figure 24:
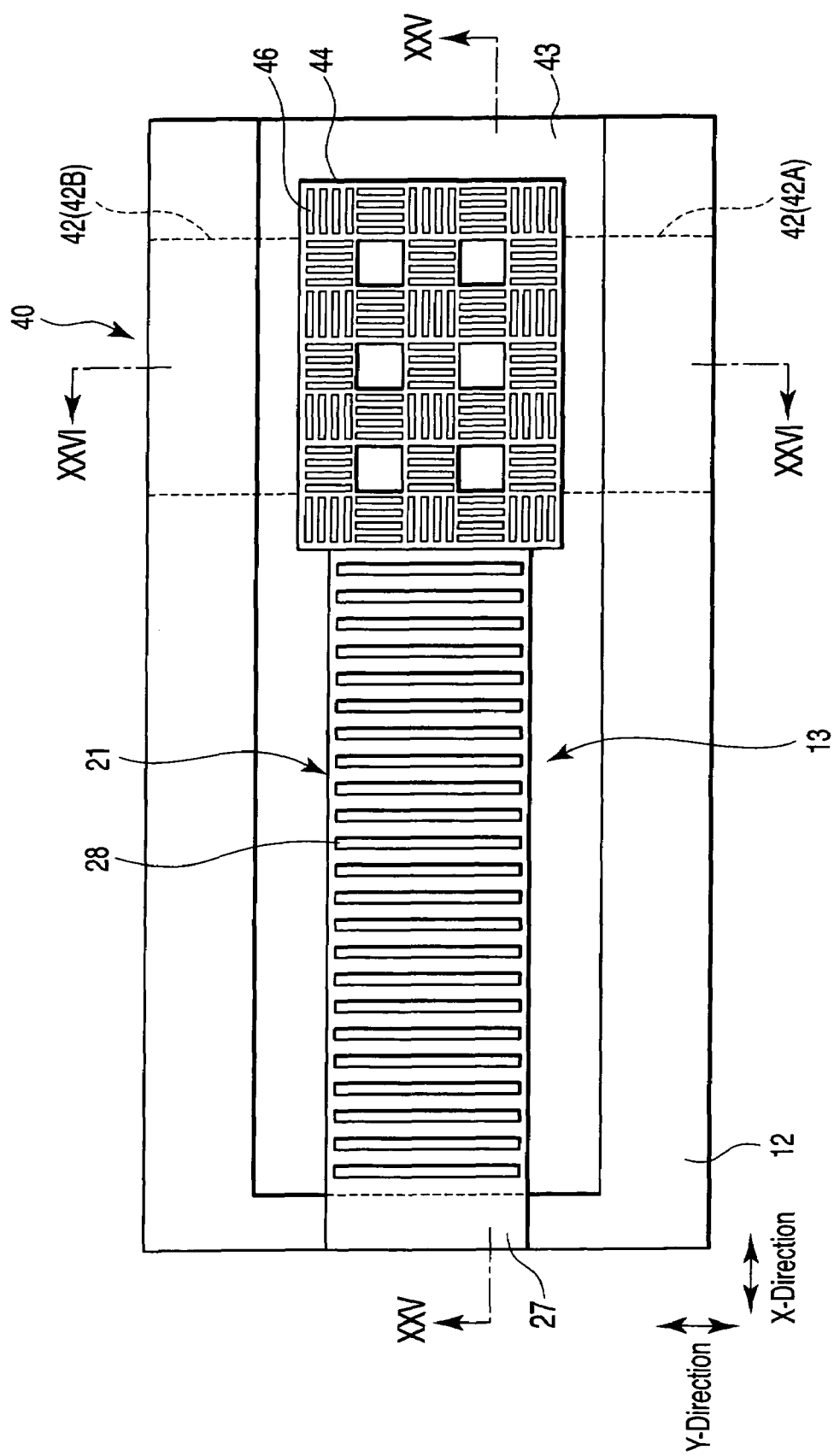
FIG. 24 is a plan view of a semiconductor device according to a fifth embodiment of the present invention.
Figure 25:
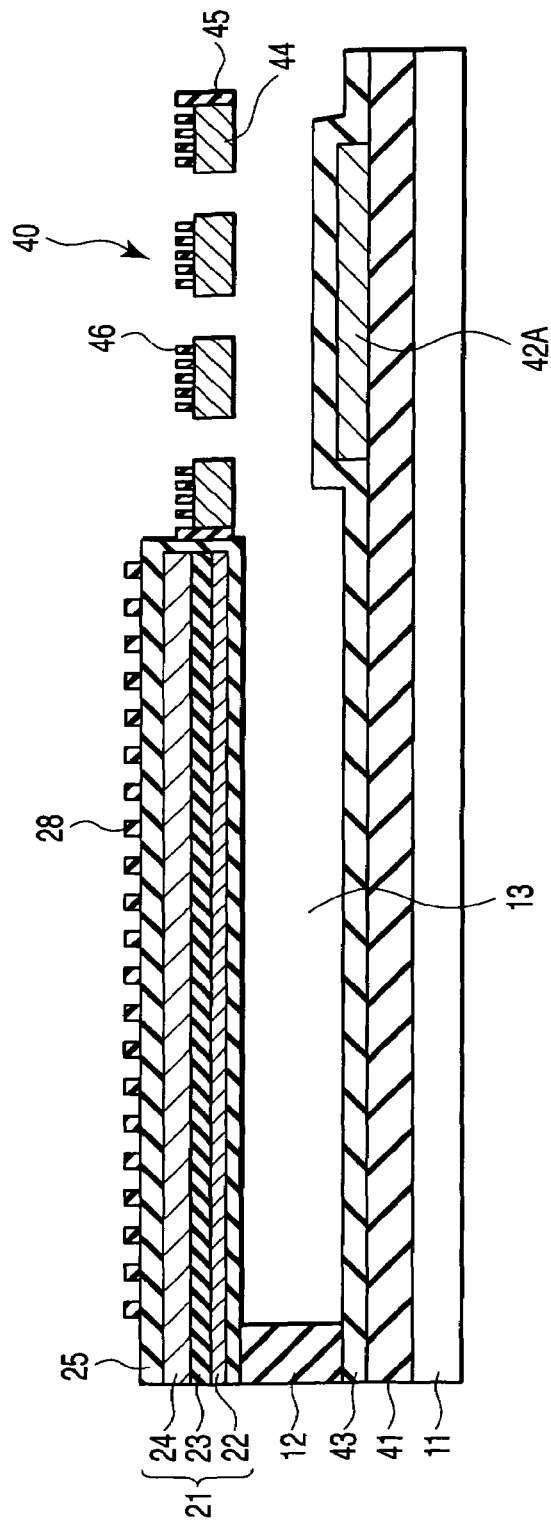
FIG. 25 is a cross-sectional view of the semiconductor device, taken along line XXV-XXV in FIG. 24.
Figure 26:
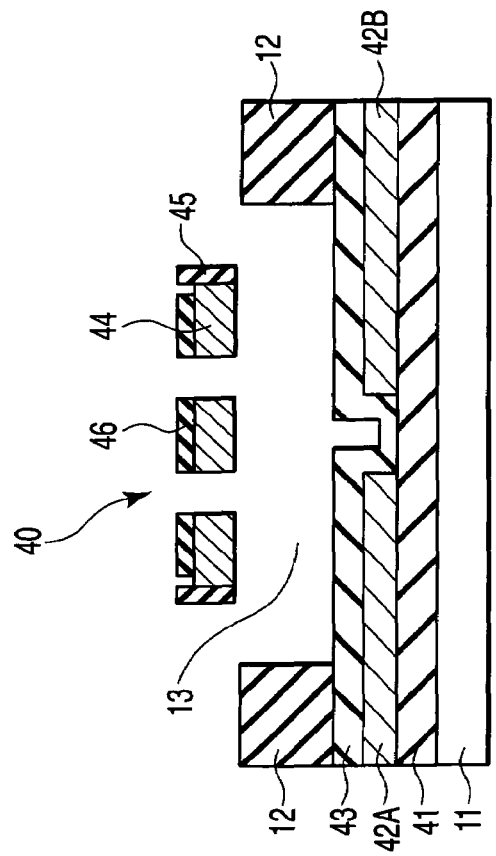
FIG. 26 is a cross-sectional view of the semiconductor device, taken along line XXVI-XXVI in FIG. 24.

A fifth embodiment of the invention relates to an example in which the present invention is applied to a variable capacitor. FIG. 24 is a plan view of a semiconductor device according to the fifth embodiment of the invention. FIG. 25 is a cross-sectional view of the semiconductor device, taken along line XXV-XXV in FIG. 24. FIG. 26 is a cross-sectional view of the semiconductor device, taken along line XXVI-XXVI in FIG. 24.

An insulating layer 41 is provided on the substrate 11. The insulating layer 41 is formed of, e.g. SiN. A first electrode layer 42 of a variable capacitor 40 is provided on the insulating layer 41. The first electrode layer 42 is formed of, e.g. Al. In this embodiment, the first electrode layer 42 of the variable capacitor 40 is composed of two electrode layers 42A and 42B. The two electrode layers 42A and 42B are provided adjacent to each other in a direction (Y-direction) perpendicular to the direction of extension (X-direction) of the actuator 21. The insulating layer 41 is provided to electrically isolate the substrate 11 and the first electrode layer 42 of the variable capacitor 40.

An insulating layer 43 is provided on the insulating layer 41 and the first electrode layer 42. The insulating layer 43 is formed of, e.g. SiN. The insulating layer 43 on the first electrode layer 42 is provided to prevent electrical contact between the first electrode layer and second electrode layer of the variable capacitor 40.

An anchor 12 is provided on the insulating layer 43. The anchor 12 is formed of, e.g. $SiO_2$. The anchor 12 is provided partly on the substrate 11. A cavity 13 for allowing movement of the actuator 21 and the second electrode layer of the variable capacitor 40 is provided in the anchor 12.

The actuator 21, which is covered with an insulating layer 25, is provided over the anchor 12 and cavity 13 so as to extend in the X-direction. Adjustment layers 28 are provided on the insulating layer 25. Thereby, the warpage of the actuator 21 can be reduced (refer to the third embodiment).

The second electrode layer 44 of the variable capacitor 40 is provided on a side surface of a distal end portion of the actuator 21 so as to extend in the X-direction. The second electrode layer 44 is provided above the electrode layers 42A and 42B. The second electrode layer 44 comprises a plurality of layers. The second electrode layer 44 is composed of an Al layer and two TiN layers that vertically sandwich the Al layer. An insulating layer 45 is provided on a side surface of the second electrode layer 44. The insulating layer 45 is formed of, e.g. $SiO_2$.

The second electrode layer 44 includes a plurality of opening portions (six opening portions in the embodiment). The opening portions are provided in order to remove a sacrificial layer that is provided under the second electrode layer 44, when the cavity 13 is to be formed under the second electrode layer 44. Specifically, the main part of the sacrificial layer under the second electrode layer 44 is etched away, making use of the opening portions. The opening portions are not related to the operation of the variable capacitor 40. The opening portions are not necessary if the sacrificial layer under the second electrode layer 44 can be removed when the cavity 13 is formed.

Since the second electrode layer 44 is composed of a plurality of layers, it tends to easily warp. A plurality of adjustment layers 46 for adjusting concave and convex portions are provided on the second electrode layer 44, thereby to adjust the warp of the second electrode layer 44. The plural adjustment layers 46 for adjusting concave and convex portions are provided partly on the second electrode layer 44. The adjustment layers 46 have, for example, tile-like shapes. Needless to say, the adjustment layer 46 may have other planar patterns as described in the first embodiment.

In the present embodiment, the second electrode layer 44 warps upward. Thus, the adjustment layers 46, which are used here, have a relatively lower residual stress than the second electrode layer 44. For example, passivation layers formed of insulating layers are used as the adjustment layers 46. Thereby, the segments of the second electrode layer 44, where the adjustment layers 46 are provided, have warps in the reversed direction. Specifically, the segments of the second electrode layer 44, where the adjustment layers 46 are provided, have convex shapes and the segments of the second electrode layer 44, where the adjustment layers 46 are not provided, have concave shapes. In this manner, the warp of the second electrode layer 44 provided over the cavity 13 can be adjusted.

Next, the operation of the variable capacitor 40 is described. First, a description is given of the non-removable state of the actuator 21. When the voltage V1, which is applied to the lower electrode layer 22 of the actuator 21, and the voltage V2, which is applied to the upper electrode layer 24, are, e.g. ground potential (0 V), the actuator 21 does not move and remains in the state as shown in FIG. 22. When the actuator 21 is in the state shown in FIG. 22, a capacitance value Cv of the variable capacitor 40 is minimum.

Next, a description is given of the movable state of the actuator 21. If the voltage V1 of the lower electrode layer 22 of the actuator 21 is set at, e.g. ground potential (0 V) and the voltage V2 of the upper electrode layer 24 is raised from 0 V to, e.g. 3 V, the piezoelectric layer 23 of the actuator 21 contracts in the lateral direction. As a result, the distal end of the actuator 21 moves downward and the distance between the first electrode layer 42 and second electrode layer 44 of the variable capacitor 40 decreases. When the actuator 21 moves and the second electrode layer 44 comes in contact with the insulating layer 43, the capacitance value Cv of the variable capacitor 40 takes a maximum value.

As described above, the voltages V1 and V2, which are applied to the lower electrode layer 22 and upper electrode layer 24 of the actuator 21, are set to move the actuator 21. As a result, the distance between the two electrode layers of the variable capacitor 40 varies, and accordingly the capacitance value Cv of the variable capacitor 40 varies.

In the present embodiment, the first electrode layer 42 of the variable capacitor 40 is composed of two electrode layers 42A and 42B which are electrically isolated, as shown in FIG. 24 to FIG. 26. The second electrode layer 44 of the variable capacitor 40 is set in the floating state.

In this case, a variable capacitor 40A (capacitance value Cva) is composed of the first electrode layer 42A and second electrode layer 44, and a variable capacitor 40B (capacitance value Cvb) is composed of the first electrode layer 42B and second electrode layer 44. The variable capacitors 40A and 40B are series-connected. Thus, the entire capacitance value Cv of the variable capacitor 40 is expressed by $$1/Cv = 1/Cva + 1/Cvb \tag{6}$$

As has been described above in detail, according to the present embodiment, the warp of the actuator 21 that constitutes the variable capacitor can be adjusted. In addition, the warp of the second electrode layer 44, which is connected to the actuator 21, can be adjusted. Thereby, the actuator 21 and second electrode layer 44 are formed substantially flat, and a high-precision variable capacitor can be constituted.

In the meantime, the first electrode layer of the variable capacitor may not be separated into two parts. Even in the case where the first electrode layer is composed of a single layer, the same advantageous effect as with the present embodiment can be obtained. In this case, wiring lines need to be connected to the second electrode layer 44.

SIXTH EMBODIMENT

In a sixth embodiment of the invention, two devices (inductor and variable capacitor) having different heights are formed on a substrate.

Figure 27:
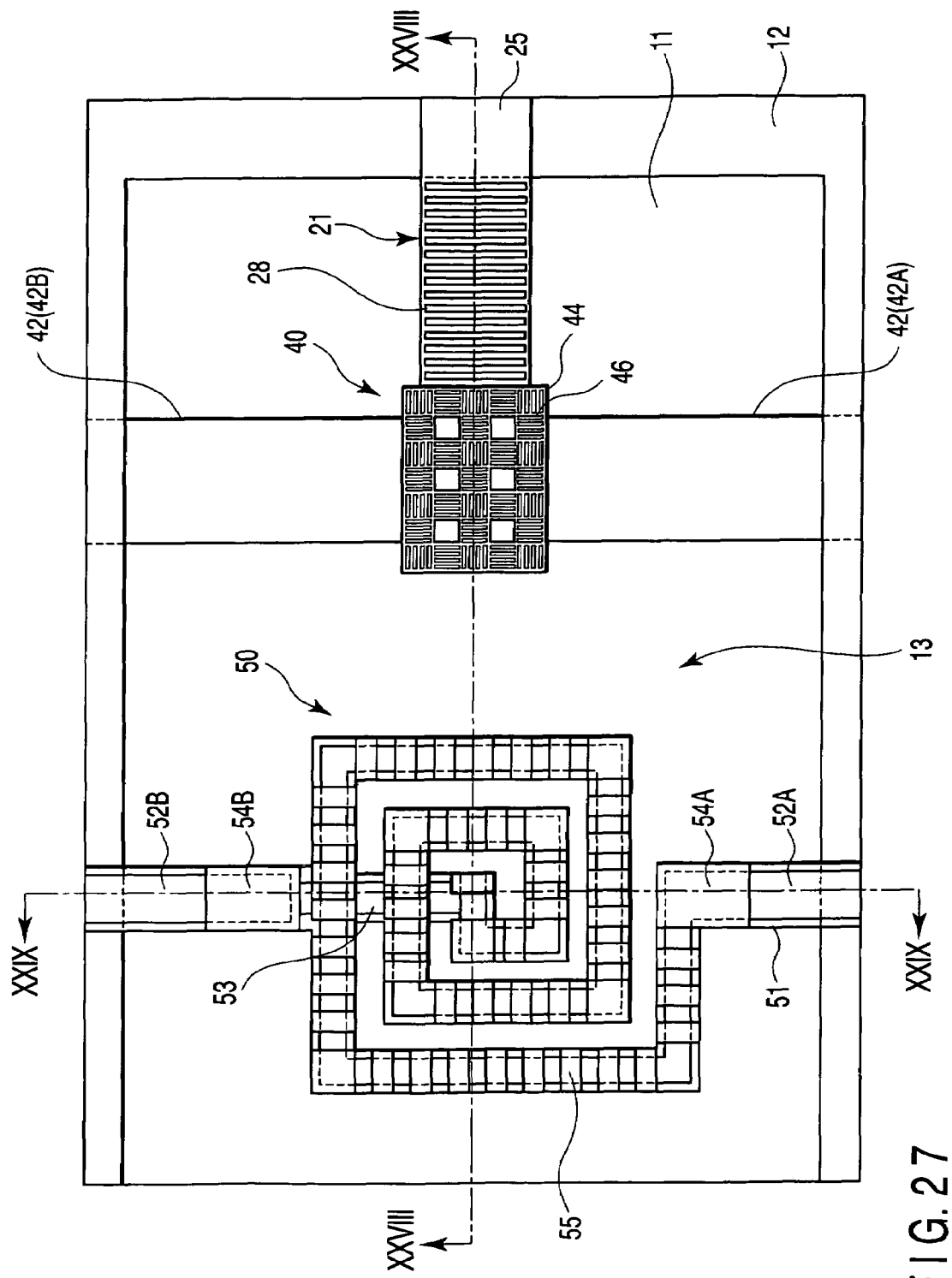
FIG. 27 is a plan view of a semiconductor device according to a sixth embodiment of the present invention.
Figure 28:
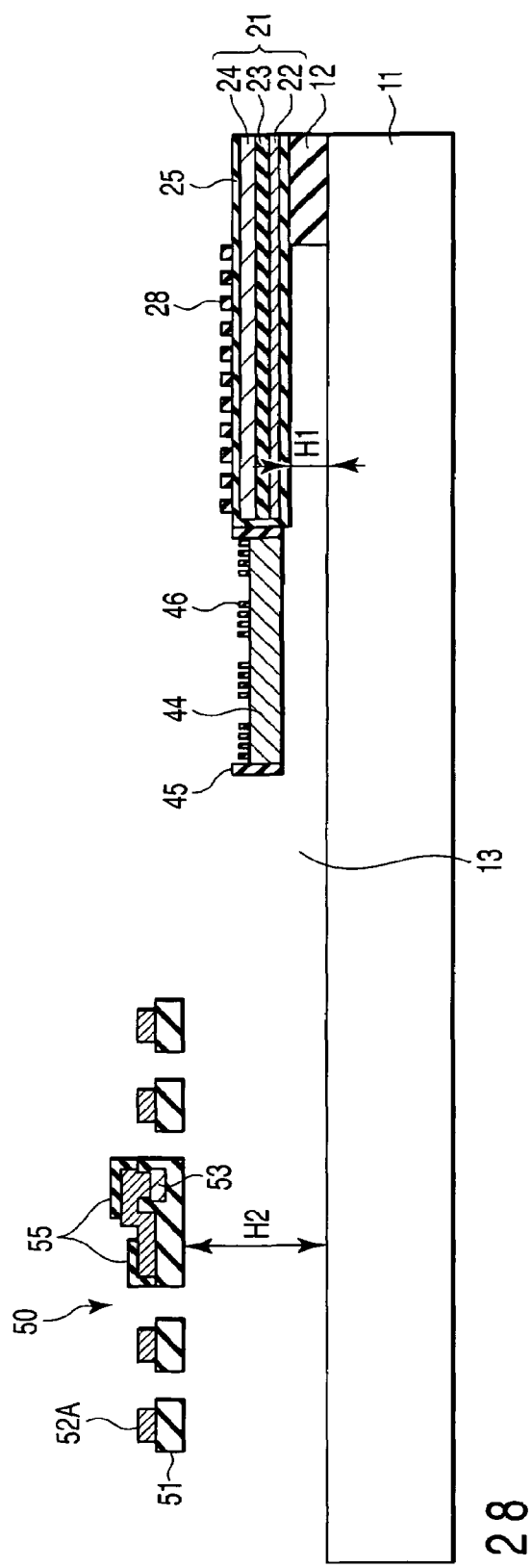
FIG. 28 is a cross-sectional view of the semiconductor device, taken along line XXVIII-XXVIII in FIG. 27.
Figure 29:
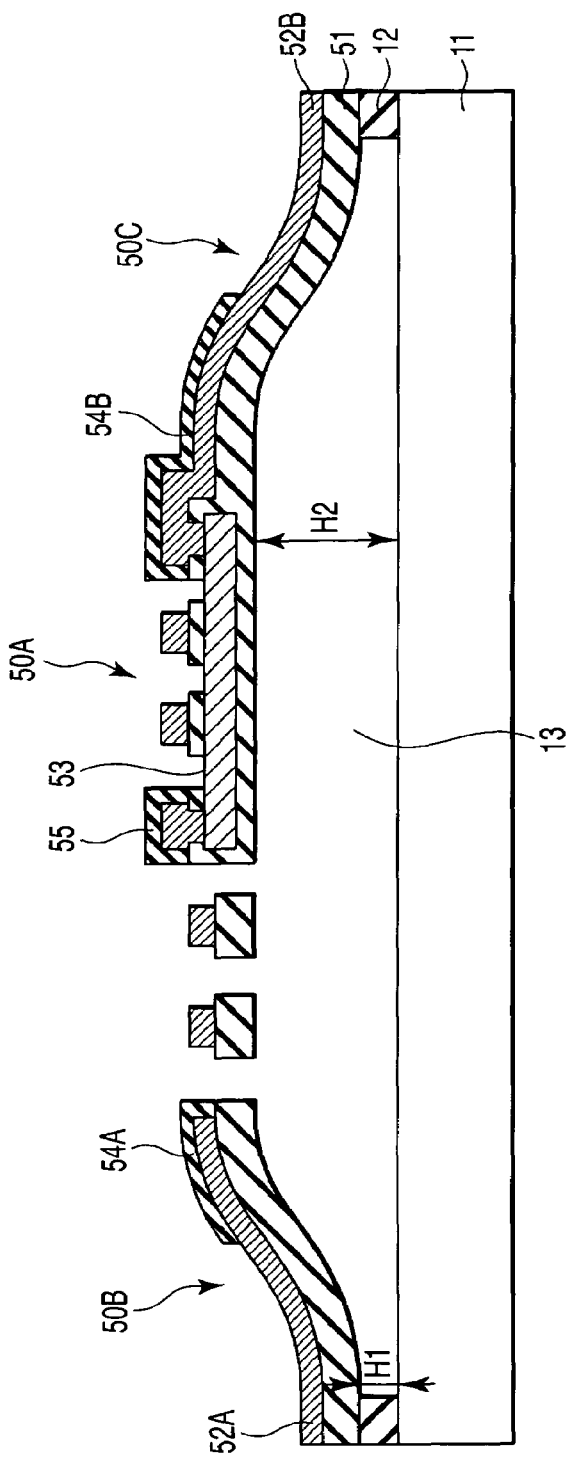
FIG. 29 is a cross-sectional view of the semiconductor device, taken along line XXIX-XXIX in FIG. 27.

FIG. 27 is a plan view of a semiconductor device according to the sixth embodiment of the invention. FIG. 28 is a cross-sectional view of the semiconductor device, taken along line XXVIII-XXVIII in FIG. 27. FIG. 29 is a cross-sectional view of the semiconductor device, taken along line XXIX-XXIX in FIG. 27. The structure of the variable capacitor 40 is the same as in the fifth embodiment. The height of the actuator 21 from the substrate 11 is H1. The height H1 of the actuator 21 is equal to the film thickness of the anchor 12.

An inductor 50 is provided over the cavity 13 and anchor 12. The planar shape of the inductor 50 may be spiral, rectangular, circular, or meandering. In this embodiment, the inductor 50 has a spiral shape, by way of example. Both end portions of the inductor 50 are provided on the anchor 12.

A specific structure of the inductor 50 will now be described. An insulating layer 51 is provided over the anchor 12 and cavity 13 so as to straddle the cavity 13. Specifically, both end portions of the insulating layer 51 are provided on the anchor 12. The insulating layer 51 is formed of, e.g. $SiO_2$.

Metal layers 52A and 52B are provided on the insulating layer 51. One end of the metal layer 52A is provided over the anchor 12. One end of the metal layer 52B is provided over the anchor 12. The metal layers 52A and 52B are formed of, e.g. Al with tensile stress.

A metal layer 53 for connecting the other ends of the metal layers 52A and 52B is provided in the insulating layer 51. The metal layers 52A and 52B and metal layer 53 are connected via contact plugs.

The inductor 50 comprises an inductor portion 50A, and two support portions 50B and 50C which support the inductor portion 50A at both ends. The inductor portion 50A corresponds to a spiral part of the inductor 50. The height H1 of the support portion 50B or 50C on the anchor 12 side is equal to the film thickness of the anchor 12. In other words, the height H1 is equal to the film thickness of the sacrificial layer for forming the cavity 13.

A plurality of adjustment layers 55 are provided on the metal layers 52A and 52B which are included in the inductor portion 50A. A beam, which is formed of the insulating layer 51 and metal layers 52A and 52B, warps upward. Thus, the adjustment layers 55, which are used here, have a relatively lower residual stress than the beam. For example, the adjustment layers 55 are formed of, e.g. $SiO_2$ with compressive stress. Thereby, the segments of the beam, where the adjustment layers 55 are provided, have warps in the reversed direction. Specifically, the segments of the beam, where the adjustment layers 55 are provided, have convex shapes, and the segments of the beam, where the adjustment layers 55 are not provided, have concave shapes. Hence, the inductor portion 50A can substantially be flattened.

Further, an adjustment layer 54A is provided on the metal layer 52A that is included in the support portion 50B. The adjustment layer 54A is formed of, e.g. $SiO_2$ with compressive stress. Thus, the support portion 50B is composed of one concave portion and one convex portion. The height H2 of the inductor portion 50A can be set at an arbitrary height by taking advantage of the warping of the beam and adjusting the lengths of the concave portion and convex portion. Similarly, the height H2 of the inductor portion 50A can be set at an arbitrary height by using an adjustment layer 54B.

In the case where the beam warps downward, the adjustment layers 54A and 54B, which have tensile stress, may be used to form the support portions 50B and 50C which are composed of concave portions and convex portions.

As has been described above in detail, according to the present embodiment, the height of the cavity at an arbitrary position can be adjusted by making use of the warp of the beam. In short, the height H2 of the cavity under the inductor portion 50A can be made greater than the height (thickness) H1 of the sacrificial layer.

For example, by setting the height H2 at 10 μm or more, preferably 30 μm, the amount of eddy current, which is generated on the substrate 11, can be reduced and the loss of the inductance can be decreased. Thereby, the characteristics of the inductor 50 can be improved. On the other hand, as regards the variable capacitor, the height H1 of the cavity is set at about 1 μm. In this manner, by making use of the warp of the beam, a plurality of cavity heights can be realized by simple processes.

A great deal of time is needed to remove a thick sacrificial layer. In the present embodiment, after a cavity with height H1 is formed, the height of the cavity at an arbitrary part is adjusted. Thus, the amount of the sacrificial layer is reduced, and the time that is needed to remove the sacrificial layer is decreased. As a result, the manufacturing cost can be reduced.

In each of the above-described embodiments, the adjustment layers for adjusting the warp of the beam are provided on the upper side of the beam. However, the invention is not limited to these embodiments. If no problem arises in fabrication steps, the adjustment layers may be provided on the lower side of the beam.

Each of the embodiments is directed to the cantilever. Needless to say, the same advantageous effects can be obtained even where each of the embodiments is applied to a beam that is fixed at both ends.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A device with a beam structure, comprising:
a substrate;
an anchor and a cavity which are provided on and over the substrate, respectively; and
a beam structure which is provided on the anchor and over the cavity, extends in a first direction and includes a plurality of convex portions and a plurality of concave portions, each of the convex portions having such a stress gradient as to provide a convex warp, and each of the concave portions having such a stress gradient as to provide a concave warp,
wherein the convex portions and the concave portions are alternately repeatedly arranged.

2. The device according to claim 1, wherein at least a part of the beam structure, where the convex portions and the concave portions are alternately repeatedly arranged, is substantially parallel to the substrate, with a ratio in length between the convex portions and the concave portions being fixed.

3. The device according to claim 1, wherein the beam structure includes a first layer, which has a first residual stress, and a plurality of adjustment layers, which are provided partly on the first layer and have a second residual stress which is different in sign from the first residual stress.

4. The device according to claim 3, wherein the first layer includes a plurality of layers having different residual stresses.

5. The device according to claim 3, wherein the second residual stress is relatively smaller than the first residual stress,
segments of the beam structure, where the adjustment layers are provided, correspond to the convex portions, and
segments of the beam structure, where the adjustment layers are not provided, correspond to the concave portions.

6. The device according to claim 3, wherein the second residual stress is relatively greater than the first residual stress,
segments of the beam structure, where the adjustment layers are provided, correspond to the concave portions, and
segments of the beam structure, where the adjustment layers are not provided, correspond to the convex portions.

7. The device according to claim 1, wherein a relational formula, $$\rho 1/\rho 2 = L1/L2,$$

is satisfied, where L1 is a total length of the concave portions, L2 is a total length of the convex portions, ρ1 is a radius of curvature of the concave portions, and ρ2 is a radius of curvature of the convex portions, and
a range of a tolerable error of a numerical value, which is calculated by the relational formula, is ±40%.

8. The device according to claim 3, wherein the adjustment layers are provided such that when the beam structure is vertically cut in an arbitrary direction, a part of the adjustment layers is present in a cross section.

9. A device with a beam structure, comprising: a substrate;
an anchor and a cavity which are provided on and over the substrate, respectively; and
a beam structure which is provided on the anchor and over the cavity, extends in a first direction and includes a base portion and a support portion,
wherein the support portion includes a first convex portion having such a stress gradient as to provide a convex warp, and a first concave portion having such a stress gradient as to provide a concave warp, the support portion adjusting a height of the base portion, which is different from a height of the anchor.

10. The device according to claim 9, wherein the base portion is substantially parallel to the substrate and includes a plurality of second convex portions and a plurality of second concave portions, each of the second convex portions having such a stress gradient as to provide a convex warp, and each of the second concave portions having such a stress gradient as to provide a concave warp, and a length of one unit comprising the first convex portion and the first concave portion of the support portion is greater than a length of one unit comprising the second convex portion and the second concave portion of the base portion.

11. The device according to claim 9, wherein the support portion includes a first layer, which has a first residual stress, and an adjustment layer which is provided partly on the first layer and has a second residual stress that is different in sign from the first residual stress.

12. A semiconductor device comprising:
a substrate;
an anchor and a cavity which are provided on and over the substrate, respectively;
an actuator which is provided on the anchor and over the cavity and extends in a first direction; and
a plurality of first adjustment layers which are added partly to the actuator and adjust a warp of the actuator.

13. The semiconductor device according to claim 12, wherein the actuator has a first residual stress, and
the first adjustment layers have a second residual stress which is different in sign from the first residual stress.

14. The semiconductor device according to claim 12, wherein the actuator includes a lower electrode layer, a piezoelectric layer which is provided on the lower electrode layer, and an upper electrode layer which is provided on the piezoelectric layer.

15. The semiconductor device according to claim 12, wherein the first adjustment layers are insulating layers.

16. The semiconductor device according to claim 14, further comprising a first insulating layer which is provided on the upper electrode layer,
wherein the first adjustment layers are provided on the first insulating layer and are dummy wiring layers.

17. The semiconductor device according to claim 12, further comprising:
a first electrode layer which is provided on the substrate and beneath the cavity;
a second insulating layer which is provided on the first electrode layer; and
a second electrode layer which extends in the first direction from a distal end portion of the actuator, is provided above the first electrode layer, and is movable downward by the actuator,
wherein the first electrode layer, the second electrode layer and the second insulating layer function as a variable capacitor.

18. The semiconductor device according to claim 17, further comprising a plurality of second adjustment layers which are added partly to the second electrode layer and adjust a warp of the second electrode layer.

19. The semiconductor device according to claim 17, further comprising an inductor provided on the anchor and over the cavity, and including an inductor portion and support portion which adjusts a height of the inductor portion and supports the inductor portion,
wherein the support portion includes a convex portion having such a stress gradient as to provide a convex warp, and a concave portion having such a stress gradient as to provide a concave warp.

20. The semiconductor device according to claim 19, wherein the inductor includes a third insulating layer and a conductive layer provided on the third insulating layer, and
the support portion includes a third adjustment layer which is provided partly on the conductive layer, which corresponds to the support portion.

* * * * *